(12) United States Patent
Chen et al.

(10) Patent No.: US 12,055,800 B2
(45) Date of Patent: Aug. 6, 2024

(54) SEMICONDUCTOR STRUCTURE

(71) Applicant: TAIWAN SEMICONDUCTOR MANUFACTURING COMPANY, LTD., Hsinchu (TW)

(72) Inventors: Yu-Hao Chen, Hsinchu (TW); Hui Yu Lee, Hsinchu (TW); Jui-Feng Kuan, Hsinchu (TW); Chien-Te Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 10 days.

(21) Appl. No.: 17/443,668

(22) Filed: Jul. 27, 2021

(65) Prior Publication Data

US 2022/0342238 A1    Oct. 27, 2022

Related U.S. Application Data

(60) Provisional application No. 63/178,777, filed on Apr. 23, 2021.

(51) Int. Cl.
| | |
|---|---|
| *G02F 1/01* | (2006.01) |
| *H10N 10/01* | (2023.01) |
| *H10N 10/17* | (2023.01) |
| *H10N 10/80* | (2023.01) |
| *H10N 10/852* | (2023.01) |
| *H10N 10/855* | (2023.01) |

(52) U.S. Cl.
CPC ............ *G02F 1/0147* (2013.01); *G02F 1/011* (2013.01); *H10N 10/01* (2023.02); *H10N 10/17* (2023.02); *H10N 10/80* (2023.02); *G02F 2203/50* (2013.01); *H10N 10/852* (2023.02); *H10N 10/855* (2023.02)

(58) Field of Classification Search
None
See application file for complete search history.

(56) References Cited

U.S. PATENT DOCUMENTS

| | | | |
|---|---|---|---|
| 6,181,456 B1 * | 1/2001 | McBrien | G02F 1/0123 385/2 |
| 2006/0138947 A1 * | 6/2006 | MacPherson | H10K 59/1275 313/631 |
| 2010/0163090 A1 * | 7/2010 | Liu | H10N 10/17 136/224 |
| 2015/0147026 A1 * | 5/2015 | Svilans | G02B 6/35 385/16 |
| 2021/0286128 A1 * | 9/2021 | Harris | G02B 6/12004 |
| 2021/0389612 A1 * | 12/2021 | Ram | G02F 1/025 |

* cited by examiner

*Primary Examiner* — Tamir Ayad
(74) *Attorney, Agent, or Firm* — Hauptman Ham, LLP

(57) ABSTRACT

A semiconductor structure includes, an optical component and a thermal control mechanism. The optical component includes a first main path that splits into a first side path and a second side path so that the first side path and the second side path are separated from one another. The thermal control mechanism configured to control a temperature of both the first side path and the second side path, wherein the first thermal control mechanism includes a first thermoelectric member and a second thermoelectric member that are positioned between the first side path and the second side path and the first thermoelectric member and the second thermoelectric member have opposite conductive types.

20 Claims, 18 Drawing Sheets

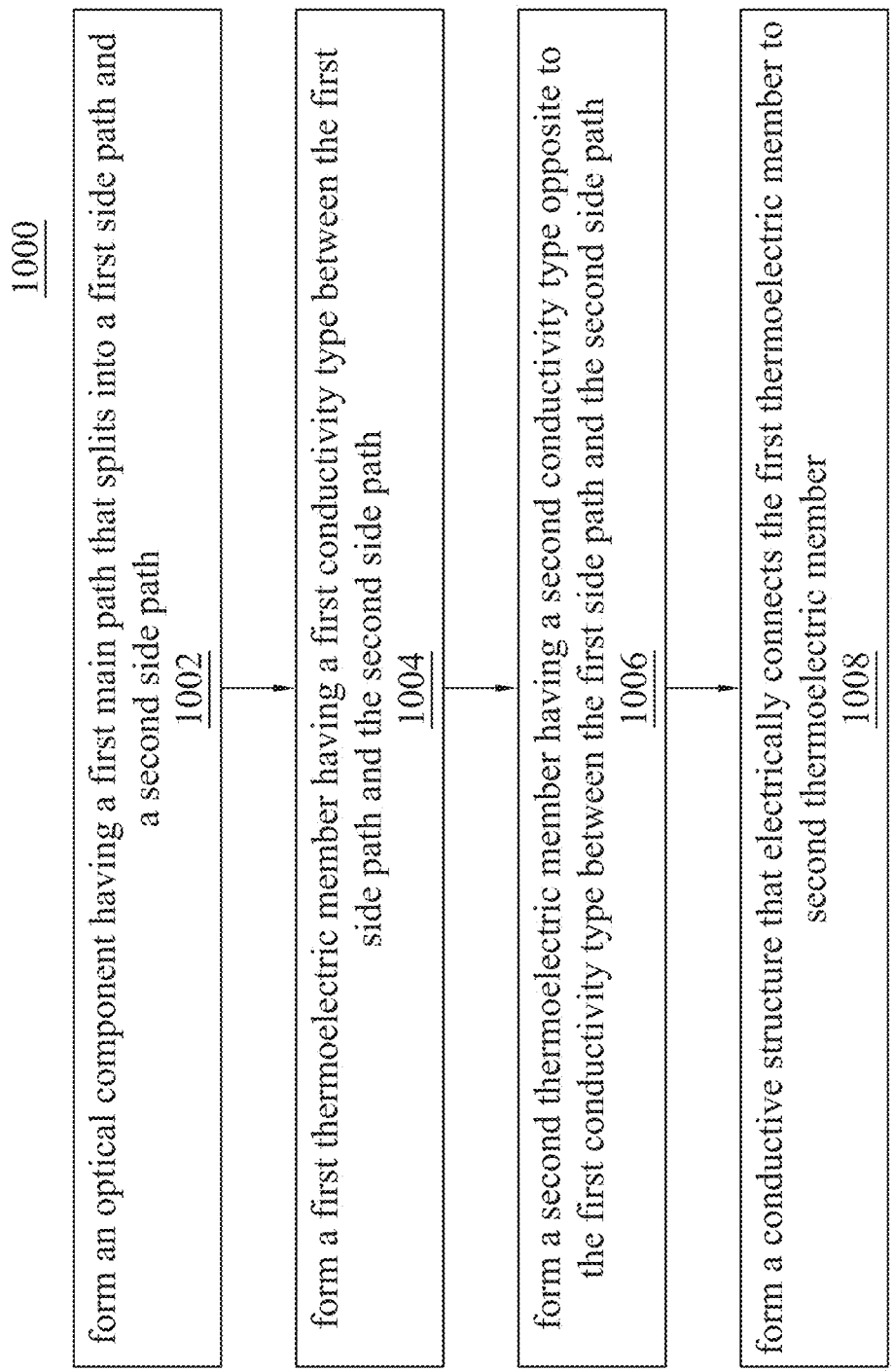

SEMICONDUCTOR STRUCTURE

PRIORITY CLAIM

The present application claims the priority of U.S. Provisional Application No. 63/178,777, filed on Apr. 23, 2021, which is incorporated herein by reference in its entirety.

BACKGROUND

The recent trend in miniaturizing integrated circuits (ICs) has resulted in smaller devices, which consume less power, yet provide more functionality at higher speeds than before. This trend has increased the importance of optical devices in ICs. As such, ICs are designed to manipulate the characteristics of optical signals propagating along optical devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a flowchart of a method of fabricating a semiconductor device, in accordance with some embodiments.

DETAILED DESCRIPTION

Figure 1:
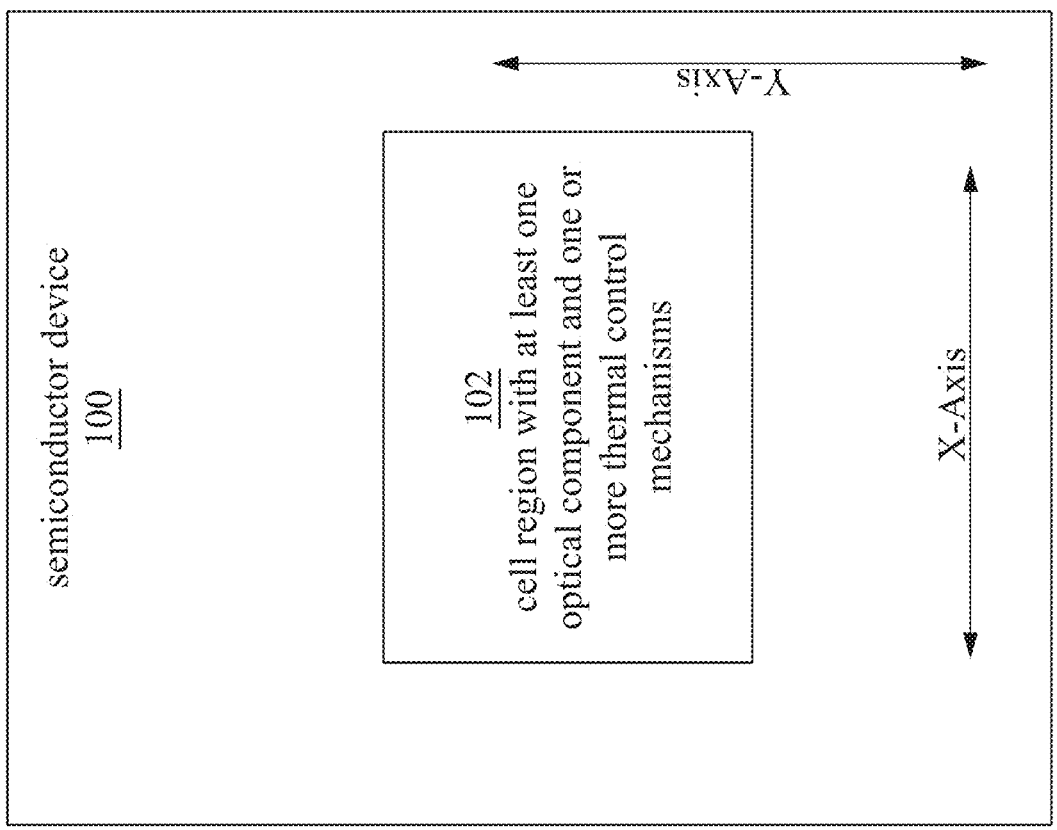
FIG. 1 is a block diagram of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram of a semiconductor device 100, in accordance with some embodiments.

In FIG. 1, semiconductor device 100 includes, among other things, a region 102. Region 102 includes at least one optical component and one or more thermal control mechanisms. The optical component is configured to transmit an optical signal. Semiconductor substrates, such as silicon (Si) substrates, have a large thermo-optic coefficient (e.g., $1.87 \times 10^{-4}$ per degree Kelvin) compared to other substrate materials such as dielectric materials. Compared with other substrate materials, such as dielectric materials, Si-photonic materials are heat sensitive and thus the phase of an optical signal propagating though an optical component is adjustable by controlling the temperature of the optical component. The thermal control mechanism is used in order to transfer heat to and from the optical component and therefore control the temperature of the optical component. In this manner, the phase of the optical signal propagating through the optical component is also controlled.

Figure 2:
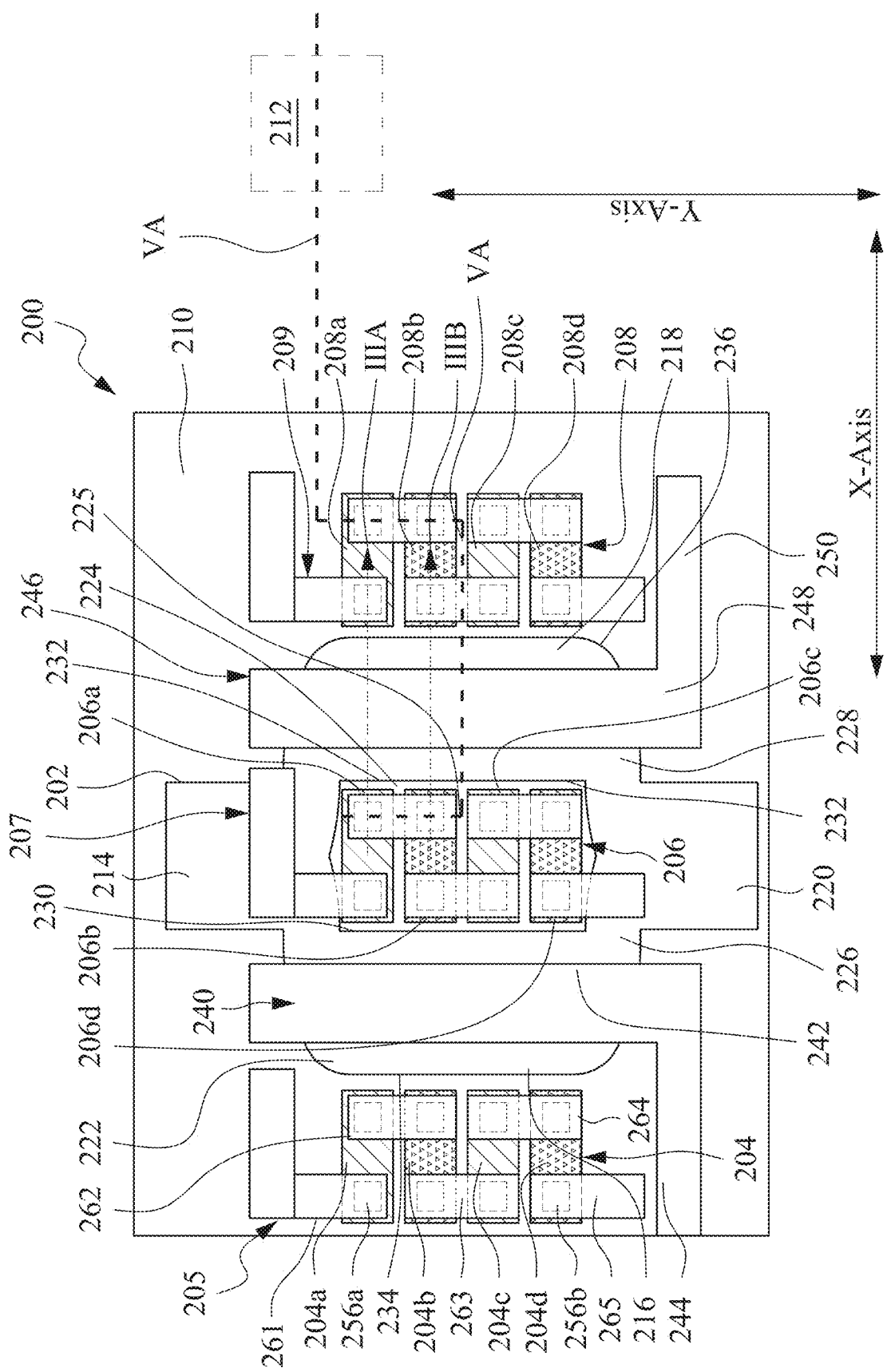
FIG. 2 is a top view of a semiconductor structure, in accordance with some embodiments.

FIG. 2 is a top view of a semiconductor structure 200, in accordance with some embodiments. Semiconductor structure 200 is an example of region 102 in FIG. 1.

Figure 3:
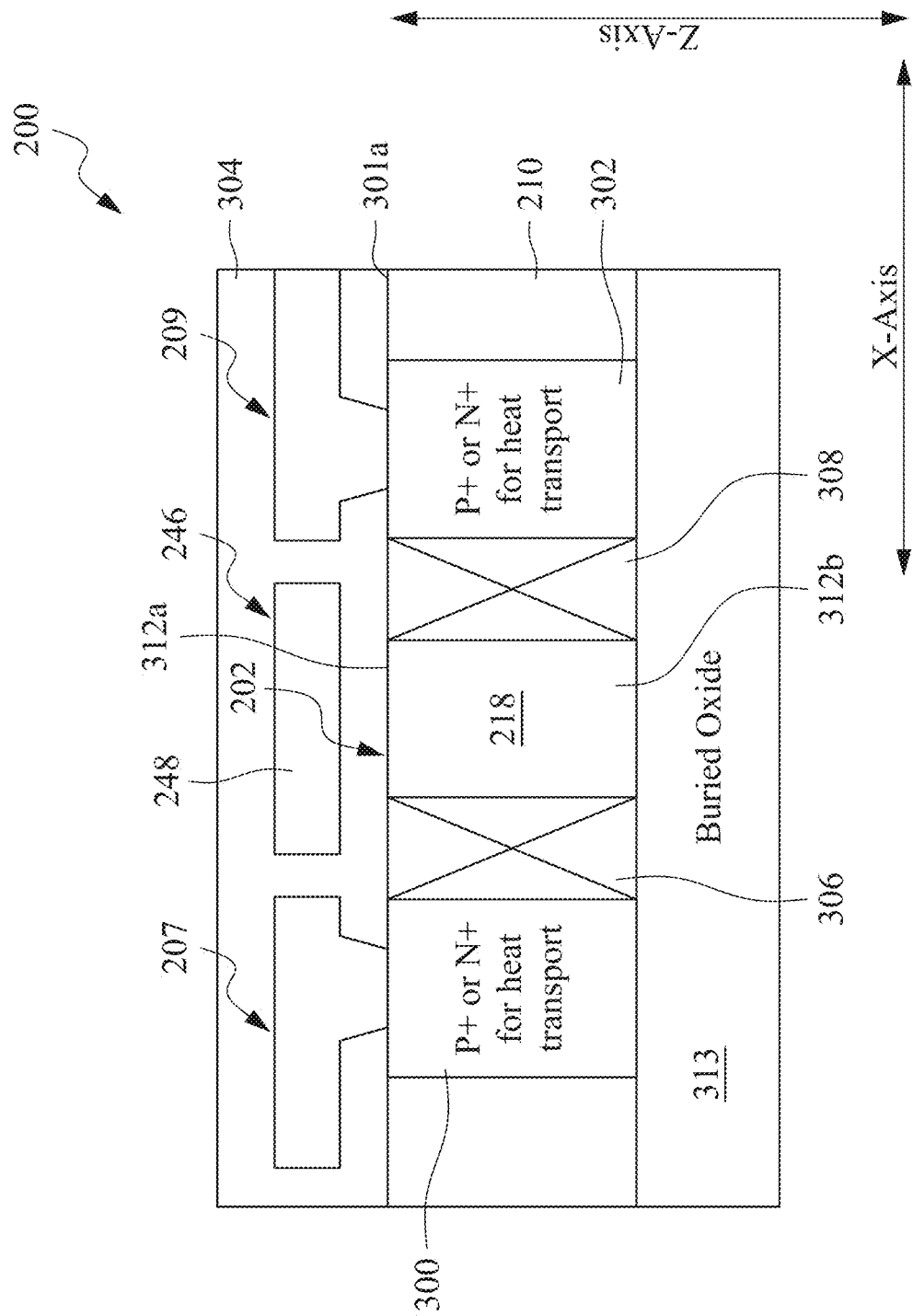
FIG. 3 illustrates a side path between thermoelectric members.

In some embodiments, the semiconductor structure 200 includes an optical component 202, thermal control mechanisms 204, 206, 208, and a substrate 210. In some embodiments, the substrate 210 is a semiconductor substrate. In other embodiments, the substrate 210 is a dielectric. In some embodiments, the dielectric is made from a silicon oxide, such as $SiO_2$. FIG. 3 is a cross sectional view along lines IIIA or IIIB across the thermal control mechanism 206, a portion of the optical component 202, and across the thermal control mechanism 208.

In some embodiments, the optical component 202 is located in the substrate 210. The optical component 202 is configured to transmit an optical signal (e.g., a light signal). In some embodiments, optical component 202 is capable of performing various operations, such as transmitting or processing an optical signal. In some embodiments, the optical component 202 includes photoelectric devices such as modulators, phase shifters, photodiode, waveguides, detectors, gratings, and/or couplers. In some embodiments, the optical component 202 includes silicon-photonic material or the like.

The optical component 202 includes a main path 214, two side paths 216, 218, and another main path 220. The main path 214 splits into the side paths 216, 218 and then the side paths 216, 218 merge into main path 220. Side paths 216, 218 connect between main paths 214, 220. Main path 214 has a long axis that extends in a first direction parallel with the Y-axis. Main path 214 then splits into two portions by extending in a second direction (approximately parallel with the X-axis) with opposite directionality to attach to an end 222 of the side path 216 and to attach to an end 224 of the side path 218. This results in a gap 225 that extends parallel to the X-axis between the side paths 216, 218. Side paths 216, 218 each have a long axis that extends parallel to the Y-axis. Side paths 216, 218 connect at the main path 220. Main path 220 also has portions that extend in the second direction with opposite directionality to attach to side paths 216, 218. Main path 220 is attached to an end 226 of the side path 216 and to an end 228 of the side path 218. In some embodiments, main paths 214, 220 and side paths 216, 218 are referred to as main waveguides 214, 220 and side waveguides 216, 218. In at least one embodiment, there are more than two side paths between the main paths 214, 220.

As such, optical component 202 is configured so that an optical signal propagated through the main path 214 is split so that a portion of the signal (i.e., first side signal) propagates through the side path 216 and a portion of the signal (i.e., second side signal) propagates through the side path 218. First side signal and second side signal merge into an optical signal at main path 220. The optical signal then propagates through main path 220. Alternatively, an optical signal propagates through the main path 220, then is split so that the first side signal propagates through the side path 216 and the second side signal propagates through the side path 218. The first side signal and second side signal merge into an optical signal at main path 214. By controlling the temperature of the side paths 216, 218 individually, the phase of each of the side signals is controlled individually to determine the constructive and destructive interference that occurs when the first and second side signals merge into the optical signal at one of the main paths 214, 220.

The side paths 216, 218 include interior sides 230, 232 that define outer edges of gap 225. Interior sides 230, 232 extend parallel to the Y-axis. The side paths 216, 218 also define exterior sides 234, 236 that border the exterior of the optical component 202. Exterior side 234 of side path 216 is opposite the interior side 230 and extends parallel to the Y-axis. Exterior side 236 of side path 218 is opposite the interior side 232 and extends parallel to the Y-axis.

To control the temperature of the side paths 216, 218 individually, the semiconductor structure 202 includes the thermal control mechanisms 204, 206, 208. Thermal control mechanism 204 includes a thermoelectric member 204a, a thermoelectric member 204b, a thermoelectric member 204c, and a thermoelectric member 204d. In this embodiment, thermoelectric members 204a, 204b, 204c, 204d are located within the substrate 210. More specifically, thermoelectric members 204a, 204b, 204c, 204d are doped regions of the substrate 210. In some embodiments, thermoelectric members 204a, 204c are n-type doped regions and thermoelectric members 204b, 204d are p-type doped regions. Thus, thermoelectric members 204a, 204c and thermoelectric members 204b, 204d are of opposite conductivity types.

In this embodiment, each of thermoelectric members 204a, 204b, 204c, 204d are rectangular. Other embodiments of thermoelectric members 204a, 204b, 204c, 204d are of another suitable shape. In this embodiment, there are four thermoelectric members 204a, 204b, 204c, 204d. In other embodiments, there are a different number of thermoelectric members 204a, 204b, 204c, 204d greater than two. There are at least two thermoelectric members in order for thermal control mechanism 204 to transfer heat; for thermal control mechanism 204 to control heat transfer there should be at least one n-type thermoelectric member and one p-type thermoelectric member.

Each of the thermoelectric members 204a, 204b, 204c, 204d has a long axis that extends parallel to the X-axis and a short axis that extends parallel to the Y-axis. Each of the thermoelectric members 204a, 204b, 204c, 204d has approximately the same dimensions. In other embodiments, one or more of the thermoelectric members 204a, 204b, 204c, 204d have different dimensions. Each of the thermoelectric members 204a, 204b, 204c, 204d is aligned with respect to the X-axis and distributed with respect to the Y-axis. As such, the thermoelectric members 204a, 204b, 204c, 204d form a column. In this column, the thermoelectric member 204b is positioned relative to the Y-axis between thermoelectric members 204a, 204c. Additionally, the thermoelectric member 204c is positioned relative to the Y-axis between thermoelectric members 204b, 204d.

The column of the thermoelectric members 204a, 204b, 204c, 204d is positioned adjacent to the exterior side 234. A conductive structure 205 comprising a plurality of conductors 261, 262, 263, 264, 265 serially connects the thermoelectric members 204a, 204b, 204c, 204d to one another so that a current flows through the column of the thermoelectric members 204a, 204b, 204c, 204d. Conductors 261, 262, 263, 264 are connected by vias 256a (only one labeled in FIG. 2 for the sake of clarity in FIG. 2) to n-type thermoelectric members 204a, 204c, and conductors 262, 263, 264, 265 are connected by vias 256b (only one labeled in FIG. 2 for the sake of clarity in FIG. 2) to p-type thermoelectric members 204b, 204d.

Figure 9A:
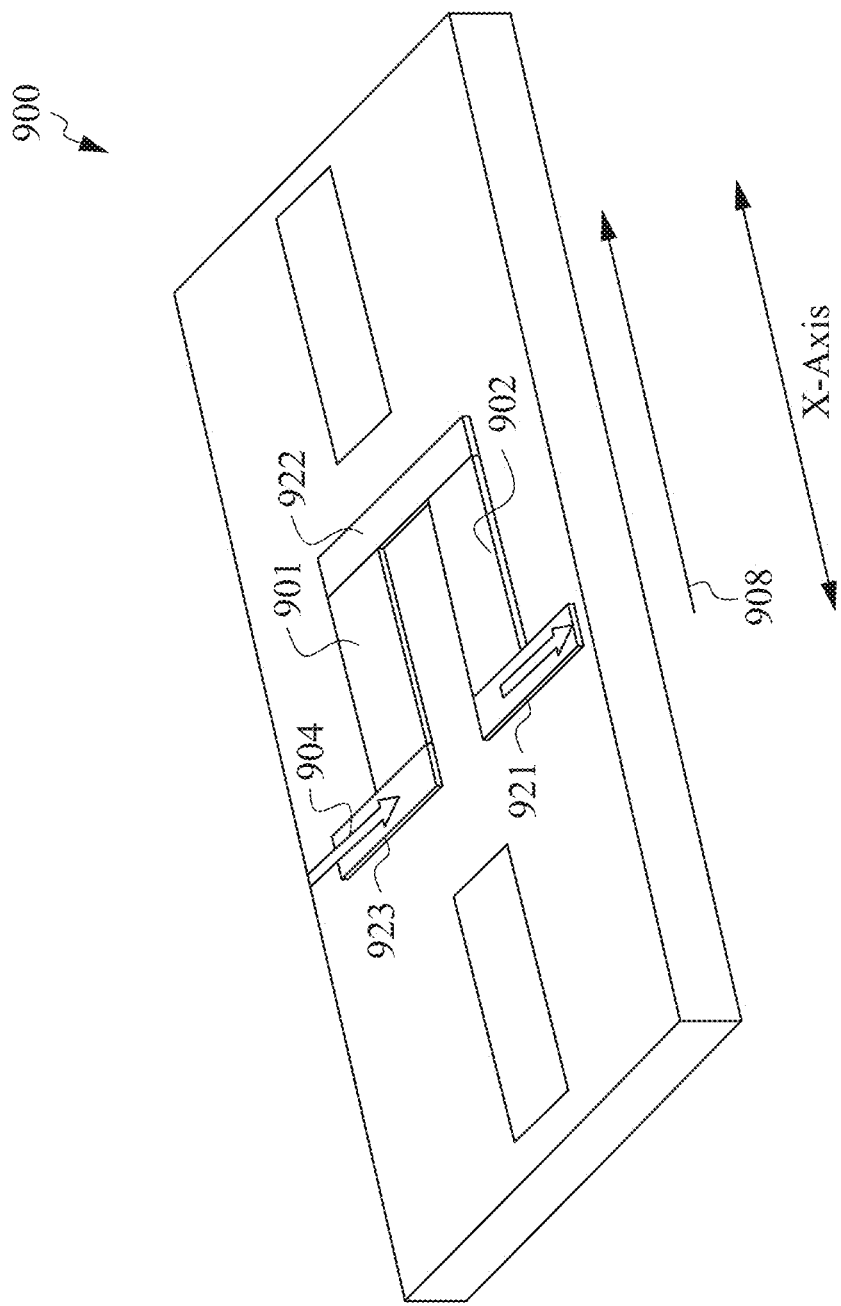
FIGS. 9A and 9B are enlarged perspective views of a thermoelectric member and a thermoelectric member.

When a current flows first through thermoelectric member 204a, then through thermoelectric member 204b, then through thermoelectric member 204c, and then through thermoelectric member 204d, heat is transferred into the side path 216 because the thermoelectric effect caused by the current results in heat flow from the left side of thermal control mechanisms 204 to the right side of thermal control mechanism 204, as described with respect to FIG. 9A. When a current flows first through thermoelectric member 204d, then through thermoelectric member 204c, then through thermoelectric member 204b, and then through thermoelectric member 204a, heat is transferred away from the side path 216 because the thermoelectric effect caused by the current results in heat flow from the right side of thermal control mechanisms 204 to the left side of thermal control mechanism 204, as described with respect to FIG. 9B. Due to the distance of thermal control mechanism 204 from the side path 218, the column of the thermoelectric members 204a, 204b, 204c, 204d has no or little effect on the heat transfer to or from the side path 218.

Thermal control mechanism 206 includes a thermoelectric member 206a, a thermoelectric member 206b, a thermoelectric member 206c, and a thermoelectric member 206d. In this embodiment, thermoelectric members 206a, 206b, 206c, 206d are located within the substrate 210. More specifically, thermoelectric members 206a, 206b, 206c, 206d are doped regions of the substrate 210. In some embodiments, thermoelectric members 206a, 206c are n-type doped regions and thermoelectric members 206b, 206d are p-type doped regions. Thus, thermoelectric members 206a, 206c and thermoelectric members 206b, 206d are of opposite conductivity types.

In this embodiment, each of thermoelectric members 206a, 206b, 206c, 206d are rectangular. Other embodiments of thermoelectric members 206a, 206b, 206c, 206d are of another suitable shape. In this embodiment, there are four thermoelectric members 206a, 206b, 206c, 206d. In other embodiments, there are a different number of thermoelectric members 206a, 206b, 206c, 206d greater than two. There are at least two thermoelectric members in order for thermal control mechanism 206 to transfer heat; for thermal control mechanism 206 to control heat transfer there should be at least one n-type thermoelectric member and one p-type thermoelectric member.

Each of the thermoelectric members 206a, 206b, 206c, 206d has a long axis that extends parallel to the X-axis and a short axis that extends parallel to the Y-axis. Each of the thermoelectric members 206a, 206b, 206c, 206d has approximately the same dimensions. In other embodiments, one or more of the thermoelectric members 206a, 206b, 206c, 206d have different dimensions. Each of the thermoelectric members 206a, 206b, 206c, 206d is aligned with respect to the X-axis and distributed with respect to the Y-axis. As such, the thermoelectric members 206a, 206b, 206c, 206d form a column. In this column, the thermoelectric member 206b is positioned relative to the Y-axis between thermoelectric members 206a, 206c. Additionally, the thermoelectric member 206c is positioned relative to the Y-axis between thermoelectric members 206b, 206d.

The column of the thermoelectric members 206a, 206b, 206c, 206d is positioned adjacent to the interior side 234 of side path 216 and adjacent to interior side 236 of side path 218. The column of the thermoelectric members 206a, 206b, 206c, 206d is thus positioned between the side path 216 and the side path 218. As such, the column of the thermoelectric members 206a, 206b, 206c, 206d are within gap 225. A conductive structure 207 comprising a plurality of conductors similar to conductors 261-265 serially connects the thermoelectric members 206a, 206b, 206c, 206d to one another, e.g., by a plurality of vias as described with respect to conductive structure 205, so that a current flows through the column of the thermoelectric members 206a, 206b, 206c, 206d.

Thermal control mechanism 206 is configured to transfer heat from the side path 216 to the side path 218 in response to the current flowing through the conductive structure 207, the thermoelectric member 206a, the thermoelectric member 206b, the thermal control member 206c, and the thermal control member 206d in a first current direction. More specifically, when the current flows first through thermoelectric member 206a, then through thermoelectric member 206b, then through thermoelectric member 206c, and then through thermoelectric member 206d, heat is transferred to the side path 218 and away from side path 216 because the thermoelectric effect caused by the current results in heat flow from the left side of thermal control mechanisms 206 to the right side of thermal control mechanism 206.

Thermal control mechanism 206 is configured to transfer heat from the side path 218 to the side path 216 in response to the current flowing through the conductive structure 207, the thermoelectric member 206a, the thermoelectric member 206b, the thermal control member 206c, and the thermal control member 206d in a second current direction. When a current flows first through thermoelectric member 206d, then through thermoelectric member 206c, then through thermoelectric member 206b, and then through thermoelectric member 206a, heat is transferred to the side path 216 and away from the side path 218 because the thermoelectric effect caused by the current results in heat flow from the right side of thermal control mechanisms 206 to the left side of thermal control mechanism 206.

Thermal control mechanism 208 includes a thermoelectric member 208a, a thermoelectric member 208b, a thermoelectric member 208c, and a thermoelectric member 208d. In this embodiment, thermoelectric members 208a, 208b, 208c, 208d are located within the substrate 210. More specifically, thermoelectric members 208a, 208b, 208c, 208d are doped regions of the substrate 210. In some embodiments, thermoelectric members 208a, 208c are n-type doped regions and thermoelectric members 208b, 208d are p-type doped regions. Thus, thermoelectric members 208a, 208c and thermoelectric members 208b, 208d are of opposite conductivity types. In some embodiments, at least one of the thermoelectric members 204a, 204b, 204c, 204d, 206a, 206b, 206c, 206d, 208a, 208b, 208c, 208d comprises at least one of doped Si, $Bi_2TE_3$, SiGe, or PbTe.

In this embodiment, each of thermoelectric members 208a, 208b, 208c, 208d are rectangular. Other embodiments of thermoelectric members 208a, 208b, 208c, 208d are of another suitable shape. In this embodiment, there are four thermoelectric members 208a, 208b, 208c, 208d. In other embodiments, there are a different number of thermoelectric members 208a, 208b, 208c, 208d greater than two. There are at least two thermoelectric members because in order for thermal control mechanism 208 to transfer heat, there needs to be at least one n-type thermoelectric member and one p-type thermoelectric member.

Each of the thermoelectric members 208a, 208b, 208c, 208d has a long axis that extends parallel to the X-axis and a short axis that extends parallel to the Y-axis. Each of the thermoelectric members 208a, 208b, 208c, 208d has approximately the same dimensions. In other embodiments, one or more of the thermoelectric members 208a, 208b, 208c, 208d have different dimensions. Each of the thermoelectric members 208a, 208b, 208c, 208d is aligned with respect to the X-axis and distributed with respect to the Y-axis. As such, the thermoelectric members 208a, 208b, 208c, 208d form a column. In this column, the thermoelectric member 208b is positioned relative to the Y-axis between thermoelectric members 208a, 208c. Additionally, the thermoelectric member 208c is positioned relative to the Y-axis between thermoelectric members 208b, 208d.

The column of the thermoelectric members 208a, 208b, 208c, 208d is positioned adjacent to the exterior side 236. A conductive structure 209 comprising a plurality of conductors similar to conductors 261-265 serially connects the thermoelectric members 208a, 208b, 208c, 208d to one another, e.g., by a plurality of vias as described with respect to conductive structure 205, so that a current flows through the column of the thermoelectric members 208a, 208b, 208c, 208d. When the current flows first through thermoelectric member 208a, then through thermoelectric member 208b, then through thermoelectric member 208c, and then through thermoelectric member 208d, heat is transferred away from the side path 218 because the thermoelectric effect caused by the current results heat to flow from the left side of thermal control mechanisms 208 to the right side of thermal control mechanism 208. When a current flows first through thermoelectric member 208d, then through thermoelectric member 208c, then through thermoelectric member 208b, and then through thermoelectric member 208a, heat is transferred towards the side path 218 because the thermoelectric effect caused by the current results heat to flow from the right side of thermal control mechanisms 208 to the left side of thermal control mechanism 208. Due to the distance between the thermal control mechanism 208 and the side path 216, the column of the thermoelectric members 208a, 208b, 208c, 208d has no or little effect on the heat transfer to or from the side path 216.

In this embodiment, thermoelectric members 204a, 206a, 208a are aligned with respect to the Y-axis and distributed with respect to the X-axis. Thermoelectric members 204b, 206b, 208b are aligned with respect to the Y-axis and distributed with respect to the X-axis. Thermoelectric members 204c, 206c, 208c are aligned with respect to the Y-axis and distributed with respect to the X-axis. Thermoelectric members 204d, 206d, 208d are aligned with respect to the Y-axis and distributed with respect to the X-axis.

A conductive structure 240 has a conductor 242 formed over the side path 216. The conductor 242 is effective to help propagate heat away from the side path 216. The conductor 242 has a long axis that extends along the Y-axis. Conductive structure 240 also includes a conductor 244 that extends along the X-axis. The conductor 244 is connected to the conductor 242. The conductor 244 propagates heat from the conductor 242 in at least one embodiment. In some embodiments, a current is controlled to flow through conductive structure 240 to heat the side path 216. In at least some embodiments, conductive structure 240 is optional.

A conductive structure 246 has a conductor 248 formed over the side path 218. The conductor 248 is effective to help propagate heat away from the side path 218. The conductor 248 has a long axis that extends along the Y-axis. Conductive structure 246 also includes a conductor 250 that extends along the X-axis. The conductor 250 is connected to the conductor 248. The conductor 250 propagates heat from the conductor 248 in at least one embodiment. In some embodiments, a current is controlled to flow through conductive structure 246 to heat the side path 218. In at least some embodiments, conductive structure 246 is optional.

The semiconductor structure 200 further comprises circuitry 212 on substrate 210. For simplicity, circuitry 212 is schematically illustrated in FIG. 2. In some embodiments, circuitry 212 includes at least a portion of a temperature sensing circuit for detecting and controlling a temperature of at least one of side paths 216, 218. An example temperature sensing circuit is described with respect to FIG. 4.

FIG. 3 is a cross sectional view taken across line IIIA or line IIIB. The thermoelectric members 300, 302 correspond to thermoelectric members 206a, 208a, with respect to line IIIA, and thermoelectric members 206b, 208b, with respect to line IIIB.

In some embodiments, the optical component 202 includes a first surface 312a and a second surface 312b opposite to the first surface 312a. In some embodiments, the first surface 312a of the optical component 202 is at a same level as a third surface 301a of the substrate 210. In some embodiments, the first surface 312a of the optical component 202 is exposed by the third surface 301a of the substrate 210. In some embodiments, the first surface 312a of the optical component 202 is lower than the third surface 301a of the substrate 210. In some embodiments, the first surface 312a of the optical component 202 is a front side of the optical component 202. In some embodiments, the second surface 312b is a back side of the optical component 202. In this embodiment, a buried oxide layer 313 is provided under the substrate 210. In some embodiments, a wafer is located beneath the buried oxide layer 313. In some embodiments, the buried oxide layer 313 is formed from a silicon oxide, such as $SiO_2$.

Thermoelectric members 300, 302 are located within the substrate 210. Above the surface 301a of the substrate 210 is a dielectric layer 304. Dielectric layer 304 is formed over and on the surface 301a. Conductive structure 205 (not shown in FIG. 3), conductive structure 207, conductive structure 209, conductive structure 240 (not shown in FIG. 3), and conductive structure 246 are located within dielectric layer 304.

FIG. 3 illustrates side path 218 between thermoelectric members 300, 302. In this embodiment, insulating block 306 is between the thermoelectric member 300 and side path 218.

Insulating block 308 is between the thermoelectric member 302 and side path 218. In some embodiments, insulating blocks 306, 308 are formed from a thermal isolation material, such as a silicon oxide (e.g., $SiO_2$). In other embodiments, insulating blocks 306, 308 are formed from a silicon nitride (e.g., $Si_3N_4$) or a polymer. Insulating blocks 306, 308 have a thermal conductivity lower than optical component 202, including main paths 214, 220 and side paths 216, 218. For example, for optical component 202 made from silicon, which has a thermal conductivity of $$149 \frac{W}{m \cdot k}$$

the insulating blocks 306, 308 are made from materials that are lower in thermal conductivity $$\left(\text{e.g., } Si_3N_4\left(10 \frac{W}{m \cdot k}\right), SiO_2\left(1.3 \frac{W}{m \cdot k}\right)\right)$$

or polymer $$\left(< 1 \frac{W}{m \cdot k}\right).$$

In some embodiments, a width of each of the insulating blocks 306, 308 is approximately between 0.028-10 um. If the width of the insulating blocks 306, 308 is less than 0.028 μm, then the insulating blocks 306, 308 do not provide sufficient insulation or effective cladding. If the width of the insulating blocks 306, 308 is greater than 10 μm, then heat transfer is not provided effectively to/from the insulating blocks 306, 308. In this manner, side path 218 is surrounded by insulating material. In some embodiments, insulating material surrounds the remainder of the optical component 202, in a similar manner. In some embodiments, insulating blocks 306, 308 form a cladding of an optical waveguide, and the side path 218 forms a core of the optical waveguide. A similar configuration is applicable to one or more of main paths 214, 220 and side path 216.

Figure 4:
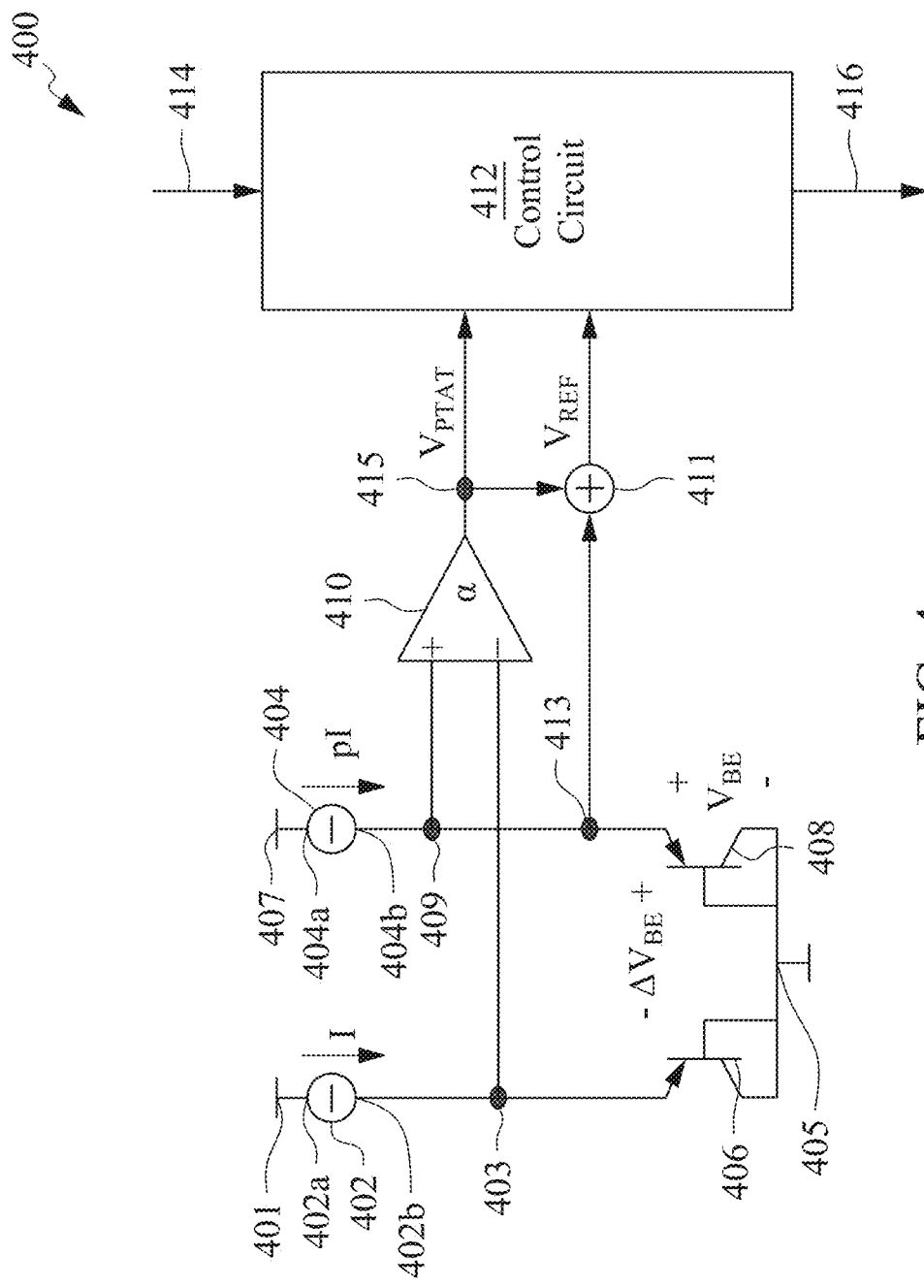
FIG. 4 is a block diagram of a temperature sensing circuit, in accordance with some embodiments.

FIG. 4 is a block diagram of a temperature sensing circuit 400, in accordance with some embodiments. In some embodiments, at least a portion of temperature sensing circuit 400 is included in circuitry 212 in FIG. 2.

The temperature sensing circuit 400 is configured to sense the temperature of the first side path 216 and the second side path 218. In some embodiments, the temperature sensing circuit 400 is configured to sense the temperature of at least one of the first side path 216 or the second side path 218. In some embodiments, a temperature sensing circuit, like the temperature sensing circuit 400 is provided to sense the temperature of first side path 216 and another temperature sensing circuit, like the temperature sensing circuit 400 is provided to sense the temperature of the second side path 218.

In some embodiments, the temperature sensing circuit 400 is a bandgap temperature sensor including a current source 402, a current source 404, a bipolar junction transistor (BJT) 406, a BJT 408, an op amp 410, a voltage adder 411, and a control circuit 412. The current source 402 is configured to generate a current I while the current source 404 is configured to generate a current p*I, where p is a current density ratio. The current source 402 has a first terminal 402a that is connected to a power source node 401. Power source node 401 is configured to receive a power supply voltage. In some embodiments, the power supply voltage is a positive direct current (DC) voltage (e.g., VDD). A second terminal 402b of the current source 402 is connected to a node 403. The current source 402 is configured to output current I from the second terminal 402b. An emitter of the BJT 406 is connected to the node 403. A collector and a base of the BJT 406 are connected to a reference node 405. Reference node 405 is configured to receive a reference voltage, such as a ground voltage.

The current source 404 has a first terminal 404a that is connected to a power source node 407. Power source node 401 is configured to receive the power supply voltage (e.g., VDD). A second terminal 404b of the current source 404 is connected to a node 409. The current source 404 is configured to output current p*I from the second terminal 402b. Second terminal 402b is connected to a node 409. An emitter of the BJT 408 is connected to a node 413. The node 409 and the node 413 are connected to one another. A collector and a base of the BJT 406 are connected to the reference node 405.

In some embodiments, p=5. Current I is fed into the emitter of the BJT 406 and the current p*I is fed into the emitter of BJT 408. The BJT 406 and the BJT 408 are both PNP transistors.

Inverting terminal of op-amp 410 is connected to node 403. Accordingly, the op-amp 410 is configured to receive the voltage of the emitter of the BJT 406 (which is the same as the base-emitter voltage of the BJT 406) at the inverting terminal of the op-amp 410. Non-inverting terminal of the op-amp 410 is connected to node 409. Accordingly, the op-amp 410 is configured to receive the voltage of the emitter of the BJT 408 (which is the same as the base-emitter voltage of the BJT 408) at the non-inverting terminal of the op-amp 410. The adder 411 has a first input connected to node 413 and a second input connected to an output terminal of the op-amp 410. Accordingly, the voltage of the emitter of the BJT 408 and a voltage at the output terminal of the op-amp 410 are received by the adder 411.

Because the two vertical BJTs 406, 408 are biased at different currents I, p*I, the voltage at the emitter of the BJT 406 and the voltage at the emitter of the BJT 408 are different. Because the saturation current has a strong positive temperature dependence, the base emitter voltage of the BJTs 406, 408 has a negative temperature dependence, which is almost linear. In some embodiments, the temperature dependence has a slope of approximately -2 mV/° C. However, the current behavior of the BJTs 406, 408 is process dependent, and as a result emitter voltage is sensitive to manufacturing variations. The effect of manufacturing variations can be compensated for by trimming the collector current (by connecting the collector and the base of BJT 406 and connecting the collector and the base of BJT 408 and setting the collectors and bases of the BJTs 406, 408 to the reference voltages). This normalizes the collector current of the BJTs 406, 408 with the saturation current at the emitter of each of the BJTs 406, 408.

In contrast, the difference in the base-emitter voltages of the two transistors $\Delta V_{BE}$, is process independent. The non-inverting terminal of the op-amp 410 is configured to receive the base emitter voltage of BJT 408 at node 409. The inverting terminal of the op-amp 410 is configured to receive the base emitter voltage at node 403. The op-amp 410 is thus configured to generate the difference in the base-emitter voltages $\Delta VBE$ with the help of an appropriate gain factor $\alpha$ (typically about 16 for p=5) to generate a temperature-dependent voltage $V_{PTAT}$ (=$\alpha \cdot \Delta VBE$) at an output terminal of the op-amp 410. The output terminal of the op-amp 410 is connected to the node 415. The adder 411 is configured to receive the base emitter voltage of the BJT 408 at node 413 and receive the voltage $V_{PTAT}$ from the node 415. The adder 411 is configure to add the base emitter voltage of the BJT 408 to the voltage $V_{PTAT}$ and generate a temperature-independent reference voltage $V_{REF}$. The voltage $V_{PTAT}$ and the voltage $V_{REF}$ are fed into the control circuit 412. The control circuit 412 is also configured to receive a voltage signal 414 having the voltage level indicative of a target phase of one of the side paths 216, 218 of the optical component 202 (See FIG. 2). The control circuit 412 is configured to generate a current 416 having a current level and a current direction so as to adjust the temperature of the one of the side paths 216, 218 to a target temperature and thereby set the corresponding first or second side signal to the target phase. In some embodiments, BJTs 406, 408 are physically disposed adjacent side path 216 or 218, whereas the remainder of temperature sensing circuit 400 is physically located further away from side path 216 or 218. The described bandgap temperature sensor is an example. Other temperature sensor circuit configurations are within the scopes of various embodiments.

Figure 5A:
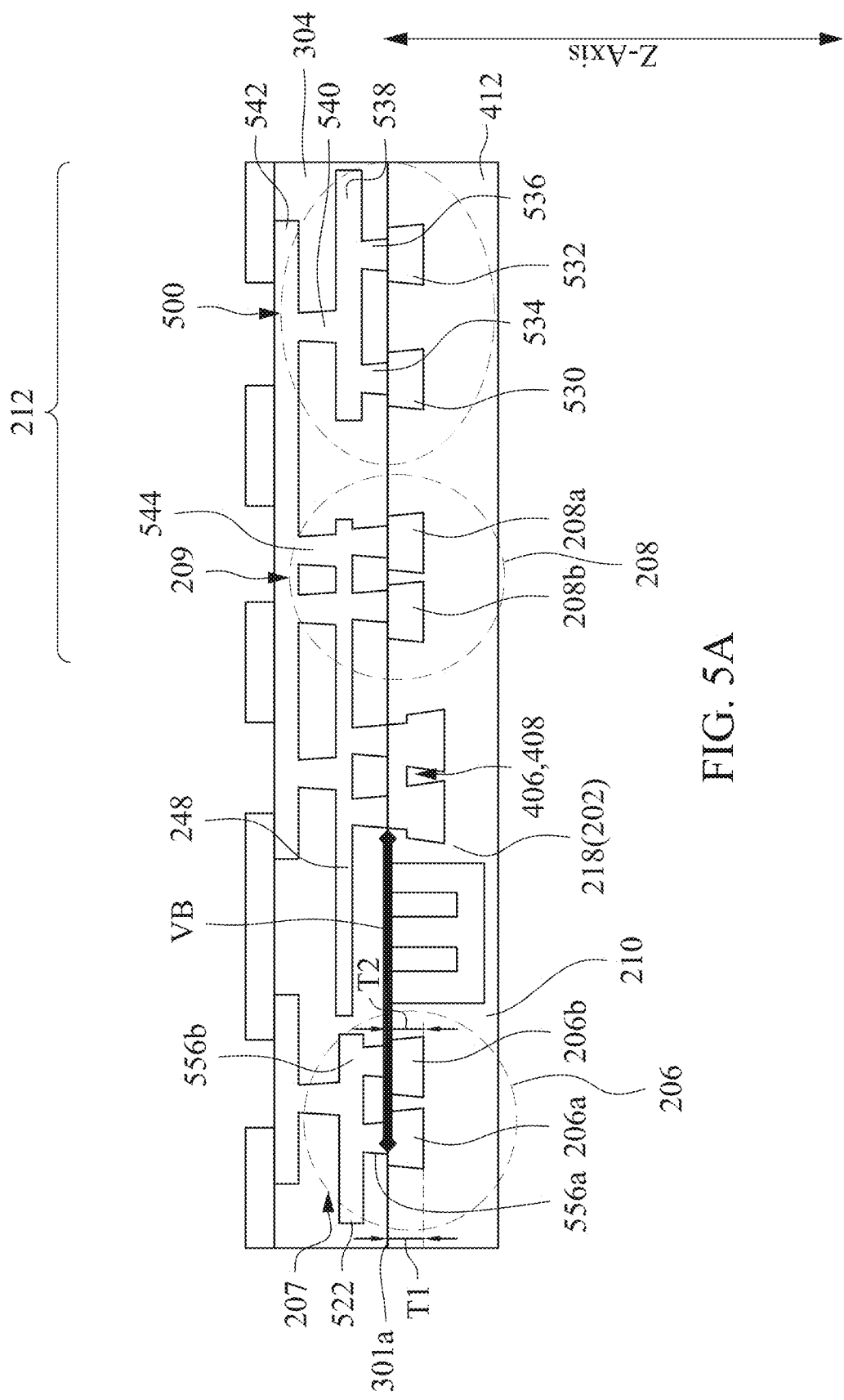
FIG. 5A is a cross sectional view of the substrate, which also includes a cross sectional view of portions of the temperature sensing circuit, in accordance with some embodiments.

FIG. 5A is a cross sectional view along line VA in FIG. 2, which also includes a cross sectional view of portions of the temperature sensing circuit 400, in accordance with some embodiments. Line VA first extends along the Y-axis across thermoelectric members 206a, 206b, then extends along the X-axis across side path 218, then extends along the Y-axis across thermoelectric members 208b, 208a, then extends along the X-axis across circuitry 212.

In the example configuration in FIG. 5A, circuitry 212 includes BJTs 406, 408 and control circuit 412 of temperature sensing circuit 400. For simplicity, op-amp 410 and adder 411 are not shown in FIG. 5A. In some embodiments, at least one of op-amp 410 or adder 411 is arranged in the same circuit region as control circuit 412, and the description herein for the physical arrangement of control circuit 412 is applicable to at least one of op-amp 410 or adder 411 in one or more embodiments.

In some embodiments, the control circuit 412 is disposed adjacent to the optical component 202. In some embodiments, the control circuit 412 is electrically connected to the optical component 202. The thermal control mechanism 208 is between the optical component 202 and the control circuit 412. In FIG. 5A, the control circuit 412 is electrically connected to the thermal control mechanisms 204 (See FIG. 2—not shown in FIG. 5A), 206, 208. The control circuit 412 is electrically connected to the thermal control mechanisms 206, 208 through the interconnect structure 500.

The interconnect structure 500 includes conductive structure 205 (See FIG. 2—not shown in FIG. 5A), the conductive structure 207, the conductive structure 209. The conductive structure 500 is at least partially surrounded by the dielectric layer 304. In some embodiments, the interconnect structure 500 includes a plurality of conductive patterns distributed in and surrounded by the dielectric layer 304. In some embodiments, the interconnect structure 500 includes a conductive material such as gold, silver, copper, nickel, tungsten, aluminum, tin and/or alloys thereof.

In some embodiments, the conductive structure 207 is disposed over the thermoelectric member 206a and the thermoelectric member 206b. In some embodiments, the conductive structure 207 is disposed over the surface 301a of the substrate 210. In some embodiments, the conductive structure 207 is surrounded by the dielectric layer 304. In some embodiments, the conductive structure 207 is configured to connect to an electrical source.

In some embodiments, the conductive structure 207 includes a first conductive member 522. The thermoelectric member 206a and the thermoelectric member 206b are beneath the first conductive member 522. The first conductive member 522 connects the thermoelectric member 206a and the thermoelectric member 206b. In some embodiments, the first conductive member 522 extends parallel to the Y-axis within the dielectric layer 304. In some embodiments, the first conductive member 522 includes conductive material such as gold, silver, copper, nickel, tungsten, aluminum, tin and/or alloys thereof.

In some embodiments, the thermoelectric member 206a includes a diffusion barrier layer at each end of the thermoelectric member 206a. In some embodiments, the thermoelectric member 206b also includes the diffusion barrier layer at each end of the thermoelectric member 206b. In some embodiments, the diffusion barrier layer includes titanium, gold, copper or the like. In some embodiments, the diffusion barrier layer is between the thermoelectric member 206a and the first conductive member 522 or between the thermoelectric member 206b and first conductive member 522.

In some embodiments, a first thickness T1 of the thermoelectric member 206a and a second thickness T2 of the thermoelectric member 206b are greater than about 0.2 μm. In some embodiments, the first thickness T1 and the second thickness T2 are between about 0.2 μm and about 50 μm. When the thickness T1, T2 is higher than 50 μm, the cost of the semiconductor structure 500 is increased; when the thickness T1, T2 is less than 0.2 μm, the resistance of the thermoelectric member 206a and the thermoelectric member 206b is increased. In some embodiments, the first thickness T1 and the second thickness T2 are between about 0.2 μm and about 2 μm. In some embodiments, a first thickness T1 of the thermoelectric member 206a and a second thickness T2 of the thermoelectric member 206b are substantially orthogonal to the surface 301a of the substrate 210. In some embodiments, a length L (discussed with respect to FIG. 5B) of the thermoelectric member 206a or the thermoelectric member 206b is greater than the first thickness T1 and the second thickness T2. In some embodiments, the first thickness T1 is substantially equal to the second thickness T2. In some embodiments, the thickness T1 is greater than the thickness T2. In some embodiments, the thickness T2 is greater than the thickness T1.

In some embodiments, the conductive structure 207 further includes a via 556a and a via 556b electrically connected to the thermoelectric member 206a and the thermoelectric member 206b, respectively. In some embodiments, vias 556a, 556b are similar to vias 256a, 256b described with respect to FIG. 2. In some embodiments, the dielectric layer 304 surrounds the via 556a and the via 556b. In some embodiments, the via 556a is between the first conductive member 522 and the thermoelectric member 206a. In some embodiments, the via 556b is between the first conductive member 522 and the thermoelectric member 206b. In some embodiments, the conductive structure 207 includes a plurality of vias 556a and a plurality of vias 556b. In some embodiments, the diffusion barrier layer is between the thermoelectric member 206a and the via 556a. In some embodiments, the diffusion barrier layer is between the thermoelectric member 206b and the via 556b. In some embodiments, the via 556a and the via 556b are omitted, and the first conductive member 522 is attached to the thermoelectric member 206a and the thermoelectric member 206b. As such, the thermal control mechanism 206 is configured to have a minimized thickness.

In some embodiments, the thermal control mechanism 206 is operated by application of a voltage. In some embodiments, the voltage is applied through the conductive structure 207. When the voltage is applied to the thermal control mechanism 206, heat generated from the optical component 202 or heat around the optical component 202 is dissipated by the thermal control mechanism 206. In some embodiments, the heat is dissipated toward the periphery of the semiconductor structure 500 or to the environment surrounding the thermal control mechanism 206. In some embodiments, the optical component 202 is heat sensitive, and therefore the thermal control mechanism 206 is able to direct heat away from the optical component 202 in order to prevent the optical component 202 from damage by heat.

In some embodiments, conductive structure 205 (See FIG. 2—not shown in FIG. 5A) and conductive structure 209 are similar to the conductive structure 207 shown in FIG. 5A. In some embodiments, the control circuit 412 is disposed adjacent to the thermal control mechanism 208. In some embodiments, the control circuit 412 is located within the substrate 210.

In some embodiments, the thermal control mechanism 208 is between the optical component 202 and the control circuit 412. In some embodiments, thermal control mechanism 208 and BJTs 406, 408 are between the optical component 202 and the control circuit 412. In some embodiments, the control circuit 412 is laterally offset from the thermal control mechanism 208 and the optical component 202 in a top view. In some embodiments, the optical component 202 and the control circuit 412 are electrically connected.

In some embodiments, the control circuit 412 is configured to transit a current so that one or more of the thermal control mechanisms 204, 206, 208 adjust the temperature of the optical component 202. One or more conductors schematically shown in FIG. 5A as a conductive member 542 are configured to connect the control circuit 412 to the thermal control mechanism 208. In some embodiments, similar conductive structures are provided to connect a control circuit (e.g. control circuit 412) to the thermal control mechanism 204. As shown in FIG. 5A, the control circuit 412 has active regions 530, 532 in the substrate 210. Active regions 530, 532 are doped regions with p-type or n-type conductivity. A via 534 connects to active regions 530 and a via 536 is connected to the active region 532. In some embodiments, a conductive member 538 is formed over and is connected to the vias 534, 536. A via 540 is formed over and is connected to the conductive member 538. The conductive member 542 further schematically represents one or more conductors which, together with one or more corresponding vias, electrically couple BJTs 406, 408 to op-amp 410 and adder 411, electrically couple op-amp 410 and adder 411 to control circuit 412, and electrically couple control circuit 412 to thermal control mechanism 208. For example, conductive member 542 is formed over and connect to the via 540. The conductive member 542 is shaped so as to extend over the conductive structure 209. A via 544 is formed under the conductive member 542 and over the conductive structure 209 to connect the conductive member 542 to the conductive structure 209. In this manner, a current 416 from the control circuit 412 is provided to the thermal control mechanism 208. In some embodiments, currents are provided to thermal control mechanisms 204, 206 in a similar manner. In some embodiments, the conductive member 542 and vias 534, 536, 540, 544 include gold, silver, copper, nickel, tungsten, aluminum, palladium and/or alloys thereof.

In FIG. 5A, BJTs 406, 408 are adjacent to the side path 218 in order to sense the temperature of the side path 218. BJTs 406, 408 are in or formed over the substrate 210. In some embodiments, BJTs are formed within the gap 225 (See FIG. 2) to sense the temperature of at least one of side paths 216, 218 of the optical component 202. In some embodiments, BJTs are placed adjacent to the side path 216 to sense the temperature of the side path 216.

Figure 5B:
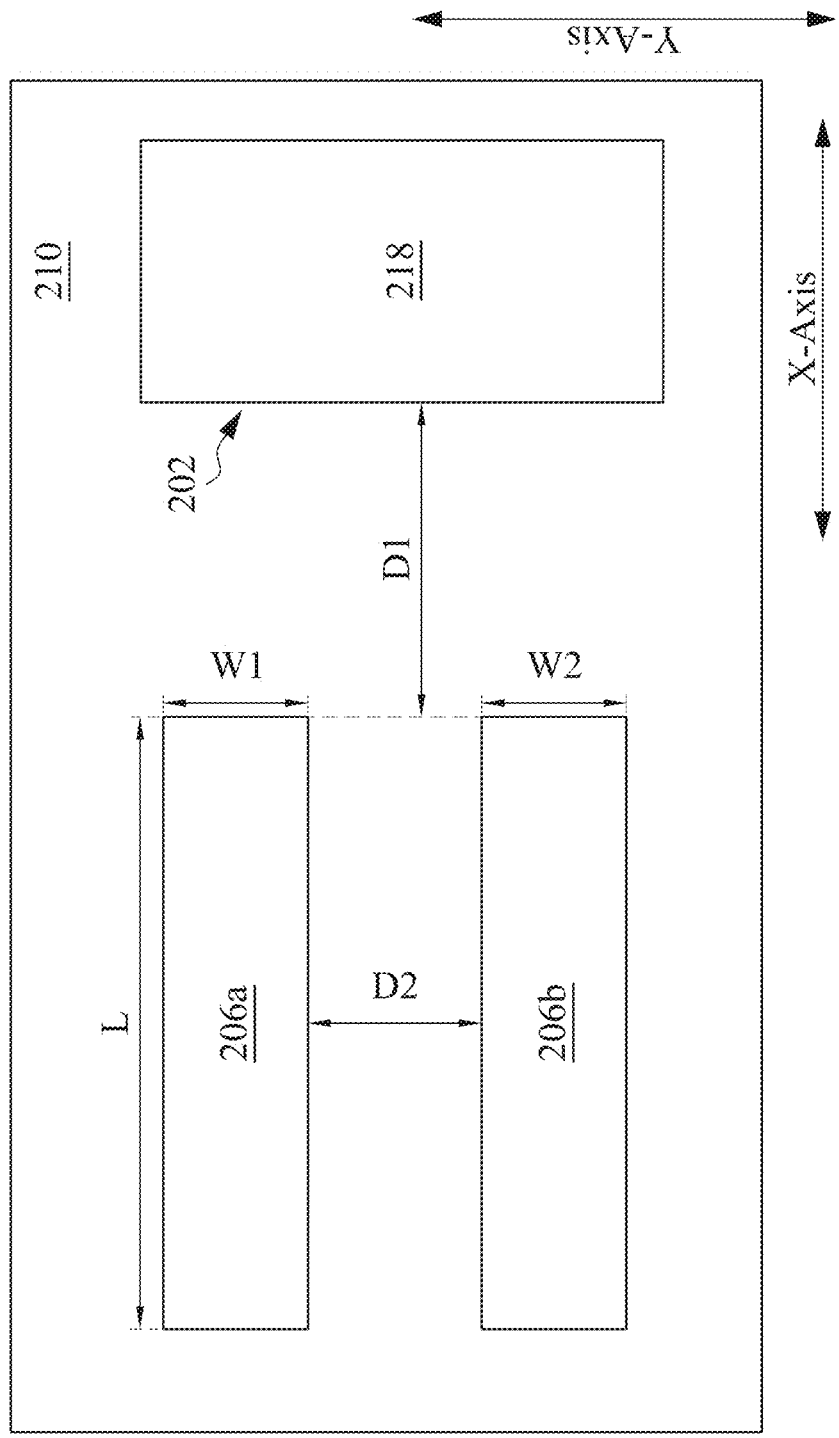
FIG. 5B is a top view of a substrate in FIG. 2.

FIG. 5B is an enlarged top view of a region including thermoelectric members 206a, 206 and side path 218 on substrate 210 in FIG. 2, in accordance with some embodiments.

In some embodiments, a width WA of the thermoelectric member 206a is between about 0.04 μm and about 500 μm. When the width WA is greater than 500 μm, the cost of the semiconductor structure 500 is increased; when the width W1 is less than 0.04 μm, the resistance of the thermoelectric member 206a is decreased. In some embodiments, the width W1 of the thermoelectric member 206a is between about 0.04 μm and about 50 μm. Similarly, a width W2 of the thermoelectric member 206b is between about 0.04 μm and about 500 μm. When the width W2 is greater than 500 μm, the cost of the semiconductor structure 500 is increased; when the width W2 is less than 0.04 μm, the resistance of the thermoelectric member 206b is decreased. In some embodiments, the width W2 of the thermoelectric member 206b is between about 0.04 μm and about 50 μm. In some embodiments, the width W1 of the thermoelectric member 206a is substantially equal to the width W2 of the thermoelectric member 206b. In some embodiments, the width W1 of the thermoelectric member 206a is different from the width W2 of the thermoelectric member 206b.

The thermoelectric member 206a and the optical component 202 are separated by a distance D1. In some embodiments, the thermoelectric member 206b and the optical component 202 are also separated by the distance D1. In some embodiments, the distance D1 is between 0.028 μm and 10 μm. In some embodiments, if the distance D1 is greater than 10 μm, then the heat transport efficiency would be too low to transfer heat in and out of the optical component so as to efficiently adjust the phase. In some embodiments, if the distance D1 is less than 0.028 μm, then the optical signal within the optical component 202 might actually be forced out of the optical component 202 due to a cladding thickness being too thin.

Although not particularly shown in FIG. 5B, a distance similar to distance D1, but between optical component 202 and BJTs 406, 408, is a design consideration in one or more embodiments. In some embodiments, such a distance is between 0.028 μm and 0.5 μm. In some embodiments, if the distance is less than 0.028 μm, then the optical signal within the optical component 202 might actually be forced out of the optical component 202 due to a cladding thickness being too thin. In some embodiments, if the distance is greater than 0.5 μm, then the sensing efficiency will be low and cause excessive lag in changing the temperature of the optical component 202.

The thermoelectric member 206a is separated from the thermoelectric member 206b by a second distance D2. In some embodiments, the second distance D2 between the thermoelectric member 206a and the thermoelectric member 206b is substantially between about 0.04 μm and about 50 μm. In some embodiments, a length L of the thermoelectric member 206a is between 0.04 μm and 100 μm. In some embodiments, the thermoelectric member 206b also has a length of L. When the length L is higher than 100 μm, the thermoelectric members 206a, 206b consume too much area; when the length L is less than 0.04 μm, the thermoelectric members 206a, 206b have difficulty creating sufficient heat transfer to and from the optical component 202. When the distance D2 is higher than 50 μm, the size of the semiconductor structure 500 has to expand; when the distance D2 is less than 0.04 μm, there is a challenge to form reliable semiconductor devices. In some embodiments, the second distance D2 is between about 0.04 μm and about 5 μm. In some embodiments, the second distance D2 is less than the length L of the thermoelectric member 206a or the length L of the thermoelectric member 206b.

Figure 6:
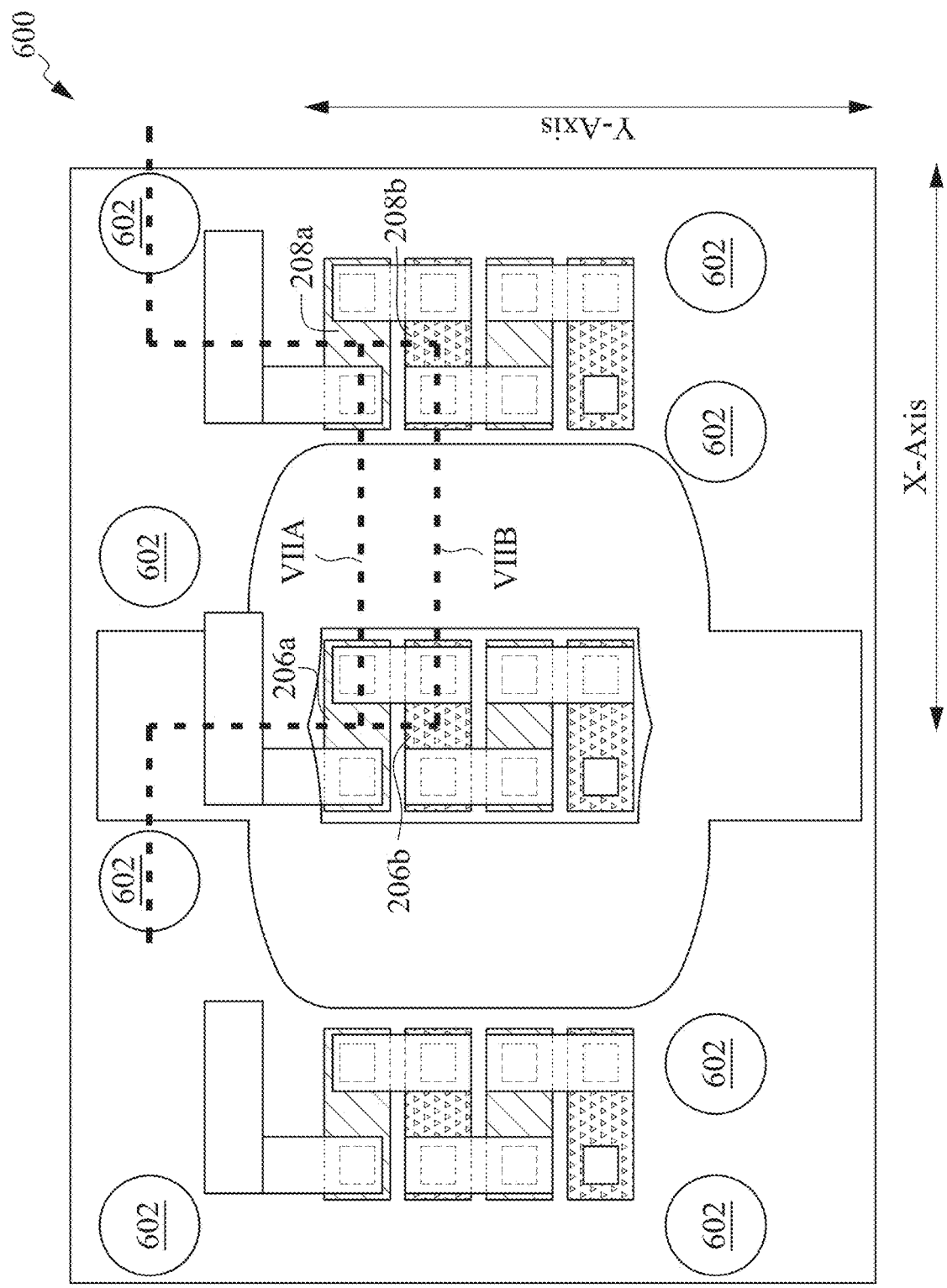
FIG. 6 is a top view of a semiconductor structure, in accordance with some embodiments.

FIG. 6 is a top view of a semiconductor structure 600, in accordance with some embodiments.

The semiconductor structure 600 is the same as the semiconductor structure 200 shown in FIGS. 2-5B, except that semiconductor structure 600 does not include conductive structure 240 and conductive structure 246. Furthermore, unlike the semiconductor structure 200, the semiconductor structure 600 includes through silicon vias or through substrate vias (TSVs) 602. In some embodiments, heat piles up and is transferred to other places by the TSVs. In some embodiments, TSVs 602 are also pathways for electrical signals, In some embodiments, the thermal conductivity of metals is high and TSVs 602 are formed from $$Cu\left(385\frac{W}{m \cdot k}\right), Al\left(205\frac{W}{m \cdot k}\right), Au\left(314\frac{W}{m \cdot k}\right), Ag\left(406\frac{W}{m \cdot k}\right).$$

Figure 7A:
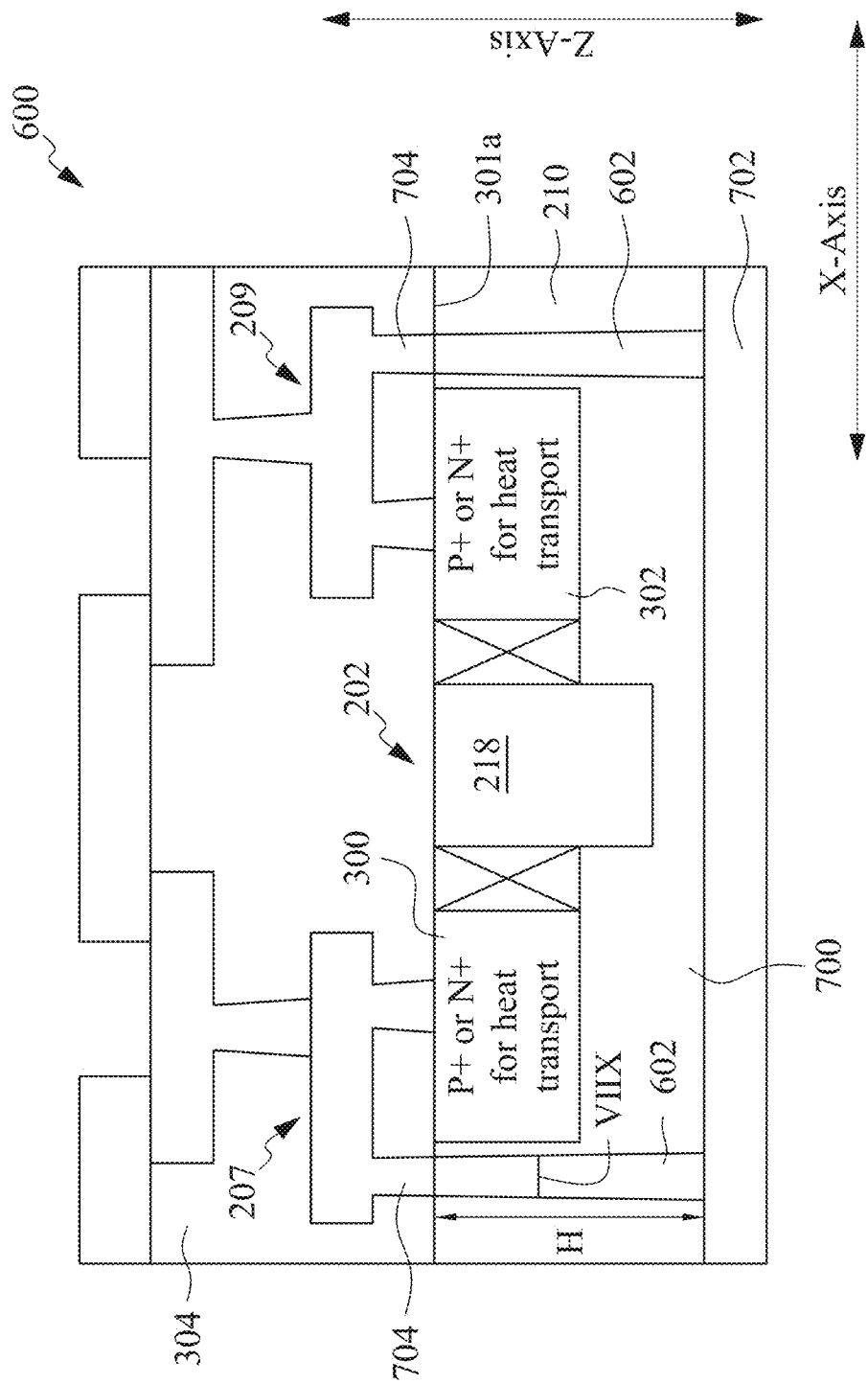
FIG. 7A is a cross sectional view of the semiconductor structure in FIG. 6, in accordance with some embodiments.
Figure 7B:
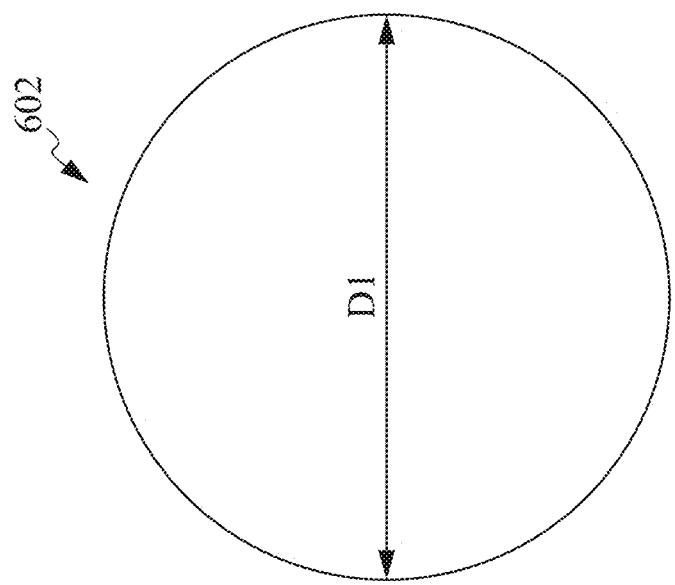
FIG. 7B is a cross sectional view of a TSV in FIG. 7A.

FIG. 7A is a cross sectional view of the semiconductor structure 600 along lines VIIA or VIIB in FIG. 6, in accordance with some embodiments. Line VIIA first extends along the X-axis across a TSV 602, then along the Y-axis, then along the X-axis across thermoelectric members 206a, 208a, then along the Y-axis, then along the X-axis across another TSV 602. Line VIIB is similar to line VIIA, except that line VIIB extends along the X-axis across thermoelectric members 206b, 208b. FIG. 7B is a cross sectional view of the TSV 602 along line VIIX in FIG. 7A, in accordance with some embodiments.

FIG. 7A is similar to FIG. 3 in that the semiconductor structure 600 includes thermoelectric members 300, 302. Along lines VIIA, thermoelectric members 300, 302 are thermoelectric members 206a, 208a, respectively. Along lines VIIB, thermoelectric members 300, 302 are thermoelectric members 206b, 208b, respectively. Furthermore, the conductive structure 207 is connected to thermoelectric member 300, as described in FIG. 5A, and conductive structure 209 is connected to thermoelectric member 302, as described in FIG. 5A. However, in this embodiment, the substrate 210 includes a surface 700 opposite to the surface 301a. A metal layer is formed on and under the surface 700. The metal layer is a heat sink 702. TSVs 602 extend through the substrate 210 to connect to heat sink 702. In this embodiment, TSV 602 have portions 704 that extend over the surface 301a. Portions 704 are thus through dielectric vias TDVs. The portions 704 connect to corresponding conductive members in the corresponding conductive structure 207 and conductive structure 209. In this manner, heat from the thermoelectric elements 206a, 206b, 208a, 208b is transferred through the TSVs 602 to the heat sink 702.

TSVs 602 have a diameter DI (see FIG. 7B) of between 2 μm-25 μm and a height H of between 20-250 μm, in some embodiments. In some embodiments, the TSVs 602 includes a conductive material such as gold, silver, copper, nickel, tungsten, aluminum, tin and/or alloys thereof. In some embodiments, the height H of the TSVs 602 is substantially equal to a thickness of the substrate 210. In some embodiments, the height of the TSVs 602 is greater than the thickness of the substrate 210. In some embodiments, the height H of the TSV 702 is between 20 μm and 250 μm due to the thickness of the substrate 210 and distance to conductive layers (e.g., MD, MO). The diameter DI is between 2 μm and 25 μm because less than 2 μm the TSV 602 does not carry sufficient heat to the heat sink 702 and greater than 25 μm the TSV 602 results in increased expense. In some embodiments, the TSV 602 is circular. In other embodiments, the TSV 602 is of another other shape including triangular, square, rectangular, pentagonal, irregular, and/or the like.

Figure 8:
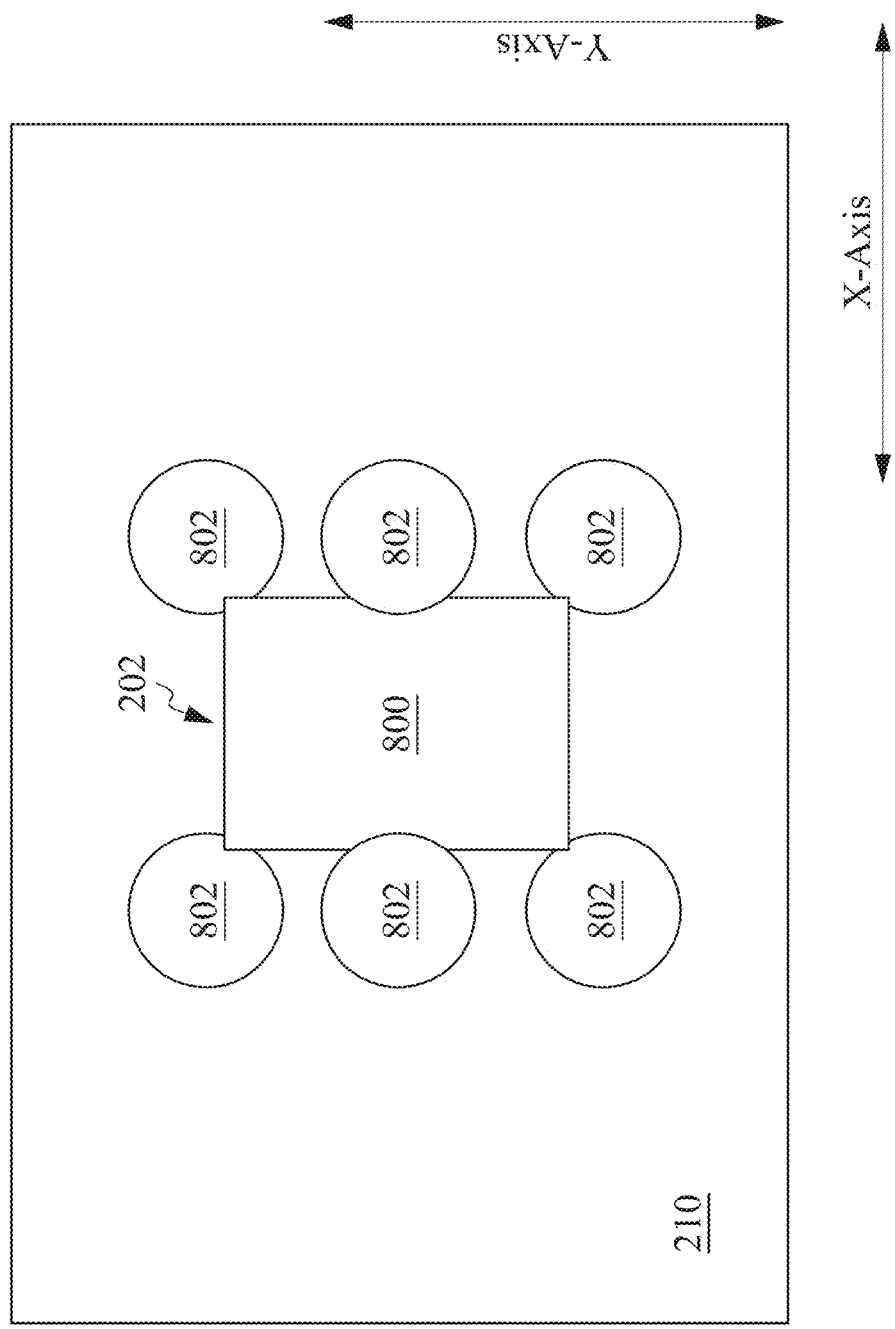
FIG. 8 is a top view of a portion of the optical component, in accordance with some embodiments.

FIG. 8 is a top view of a portion 800 of the optical component 202, in accordance with at least one embodiment. In this embodiment, the portion 800 is surrounded by TSVs 802, which are similar to the TSVs 602 in FIGS. 6, 7A, 7B.

The TSVs 802 surround the optical component 202 in order to transfer heat away from the optical component 202 to the heat sink 702 (shown in FIG. 7A).

Figure 9B:
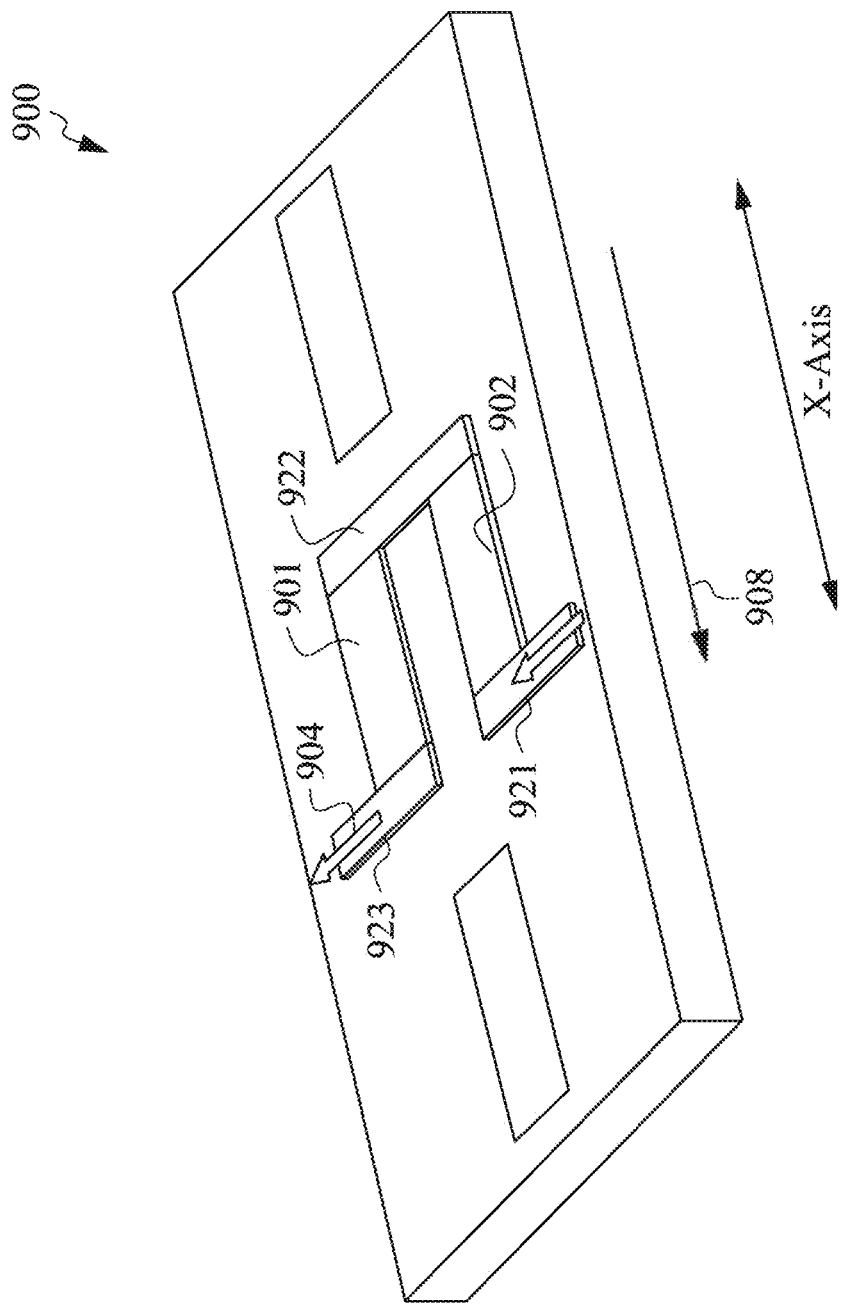

FIGS. 9A and 9B are enlarged perspective views of a portion of a thermal control mechanism 900, in accordance with. The thermal control mechanism 900 comprises thermoelectric member 901 and a thermoelectric member 902. The thermoelectric member 901 is an n-type thermoelectric member. Thus, thermoelectric member 901 corresponds to one of the thermoelectric members 204a, 206a, 208a, 204c, 206c, 208c in FIG. 2. Thermoelectric member 902 is a p-type thermoelectric member. Thus, thermoelectric member 902 corresponds to one of the thermoelectric members 204b, 206b, 208b, 204d, 206d, 208d in FIG. 2.

A thermal sensing circuit, e.g., the thermal sensing circuit 400 shown in FIG. 4, controls the current direction of a current 904 flowing through the thermal control mechanism 900, and causes the thermal control mechanism 900 to transfer heat to and from the optical component 202 (shown in FIG. 2). Thermal control mechanism 900 corresponds to one of thermal control mechanisms 204, 206, 208. As such, the thermal control mechanism 900 is capable of adjusting the temperatures of the optical component 202. In some embodiments, by controlling the current direction, the optical component 202 is cooled. In some embodiments, the thermal control mechanism 900 is capable of transferring heat from one portion of the optical component 202 to another portion of the optical component 202 (e.g., between the side path 216 and side path 218). In other embodiments, the thermal control mechanism 900 is configured to transfer heat to the optical component 202. By controlling the current direction, the thermal control mechanism 900 is configured to control the direction of the heat transfer.

In some embodiments, referring to FIG. 9A, a current 904 flows through the thermal control mechanism 900, and heat 908 is transferred with a first directionality relative to the X-axis. The current 904 flows from a conductive member 923 to the thermoelectric member 901, then to the conductive member 922, then to the thermoelectric member 902 then to the conductive member 921 to transfer the heat with the first directionality. In some embodiments, the thermal control mechanism 900 surrounds the thermal sensing circuit 400 and the optical component 202. In some embodiments, at least one of conductive members 921-923 corresponds to at least one of conductive members 261-265 in FIG. 2, or conductive member 522 in FIG. 5.

In some embodiments, referring to FIG. 9B, the current 904 flows through the thermal control mechanism 900, and heat 908 is transferred with a second directionality parallel to the X-axis that is opposite the first directionality. The current 904 flows from the conductive member 921 to the thermoelectric member 902, then to the conductive member 922, then to the thermoelectric member 901 then to the conductive member 923 to transfer heat with the second directionality.

FIG. 10 is a flowchart 1000 of a method of fabricating a semiconductor device, in accordance with some embodiments.

Flowchart 1000 is an exemplary embodiment of block 1004 in FIG. 10. Example semiconductor devices that are fabricated by flowchart 1000 include semiconductor device 100 in FIG. 1, semiconductor structure 200 in FIGS. 2-5, semiconductor structure 600 in FIGS. 6-7, substrate 210 in FIG. 8, optical components 202 in FIG. 9A and FIG. 9B.

At block 1002, an optical component having a first main path that splits into a first side path and a second side path is formed. In some embodiments, optical component is formed in a semiconductor substrate and in other embodiments, optical component is formed in a dielectric layer. In some embodiments, the substrate is a semiconductor substrate that includes silicon, silicon germanium (SiGe), gallium arsenic, or other suitable semiconductor materials. Active regions are formed in or over the substrate, using one or more masks corresponding to one or more active regions in the layout diagrams described herein. Example semiconductor substrates include the substrate 210 shown in FIGS. 1-8. An example of the optical component includes optical component 202 shown in FIGS. 1-9B. In some embodiments, optical component is formed from a silicon-photonic material within the substrate. In other embodiments, the optical component is formed in a dielectric layer. Examples of the first side path and the second side path include side paths 216, 218 in FIGS. 2 and 6. Examples of the main path include main path 214 and main path 220 in FIGS. 2 and 6. From block 1002, flow then proceeds to block 1004.

At block 1004, a first thermoelectric member is formed. The first thermoelectric member is of a first conductivity type and the first thermoelectric member is formed between the first side path and the second side path. In some embodiments, this includes doping a region of the substrate. In other embodiments, this involves forming a cavity in the dielectric and filling the cavity with a doped thermoelectric material. Examples of the first thermoelectric member are thermoelectric members 204a, 204b, 204c, 204d, 206a, 206b, 206c, 206d, 208a, 208b, 208c, 208d in FIGS. 2 and 6, thermoelectric members 300, 302 in FIG. 3 and FIG. 7A, thermoelectric members 206a, 206b, 208a, 208b in FIG. 5A, and thermoelectric members 901, 902 in FIGS. 9A, 9B. Examples of the first conductivity type are P-type conductivity and N-type conductivity.

At block 1006, a second thermoelectric member is formed. The second thermoelectric member is of a second conductivity type and the second thermoelectric member is formed between the first side path and the second side path. The second conductivity type is opposite the conductivity type of the first thermoelectric member. In some embodiments, this includes doping a region of the substrate. In other embodiments, this involves forming a cavity in the dielectric and filling the cavity with a doped thermoelectric material. Examples of the second thermoelectric member are thermoelectric members 204a, 204b, 204c, 204d, 206a, 206b, 206c, 206d, 208a, 208b, 208c, 208d in FIG. 2, thermoelectric members 300, 302 in FIG. 3 and FIG. 7A, thermoelectric members 206a, 206b, 208a, 208b in FIG. 5A, and thermoelectric members 901, 902 in FIGS. 9A, 9B. Examples of the first conductivity type are P-type conductivity and N-type conductivity so long as the conductivity type is opposite the first conductivity type of the first thermoelectric member.

At block 1008, a conductive structure is formed that electrically connects the first thermoelectric member to the second thermoelectric member. Examples of the conductive structure include conductive structures 205, 207, 209 in FIGS. 2 and 6, conductive structures 207, 209 in FIGS. 3, 5, 6, 7, and conductive members 921, 922, 923 in FIGS. 9A, 9B.

In at least one embodiment, a dielectric layer is formed that surrounds the conductive structure. In some embodiments, the dielectric layer is formed from a silicon oxide, such as SiO2. Examples of the dielectric layer include dielectric layer 304 in FIGS. 3, 7A. In some embodiments, dielectric sublayers are deposited to form dielectric layer, in some embodiments. These dielectric sublayers are etched and cavities in the dielectric sublayers are deposited with a conductive material, such as a metal. In this manner, conductive members and vias are formed in the dielectric layer to provide the conductive structures.

FIGS. 11 to 15 are schematic cross-sectional views of a semiconductor structure during various stages of manufacturing in accordance with some embodiments. In some embodiments, the method is usable to form one or more semiconductor devices described with respect to FIGS. 1-8.

Figure 11:
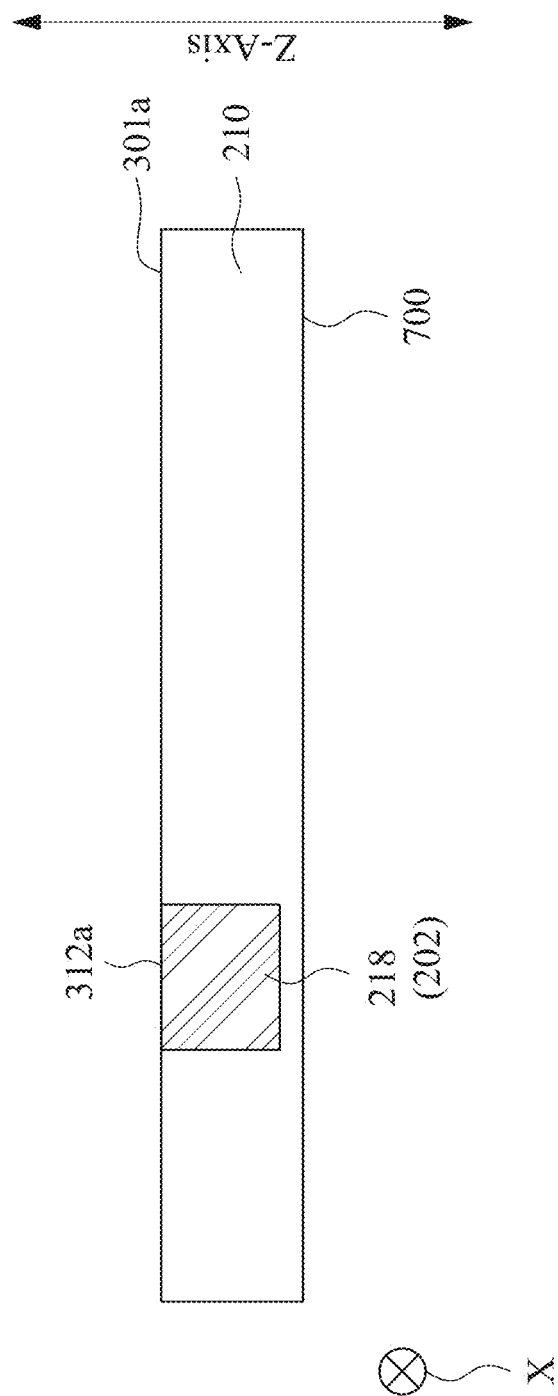
FIGS. 11 to 15 are schematic cross-sectional views of a semiconductor structure during various stages of manufacturing in accordance with some embodiments.

As illustrated in FIG. 11, in this operation, an optical component 202 surrounded by a substrate 210 is formed. For simplicity, only side path 218 is illustrated in FIGS. 11-15. In some embodiments, the optical component 202 is embedded in the substrate 210. In some embodiments, the substrate 210 is formed by suitable fabrication techniques such as spin coating, chemical vapor deposition (CVD), plasma-enhanced chemical vapor deposition (PECVD), or the like. In some embodiments, the substrate 210 is comprised of a single layer or multiple layers stacked over each other.

In some embodiments, this operation further includes adjusting a first surface 312a of the optical component 202 to be coplanar with a surface 301a of the substrate 210. In some embodiments, this operation further includes exposing the first surface 312a of the optical component 202 through the surface 301a of the substrate 210. The substrate 210 includes a surface 700 opposite to the surface 301a.

Figure 12:
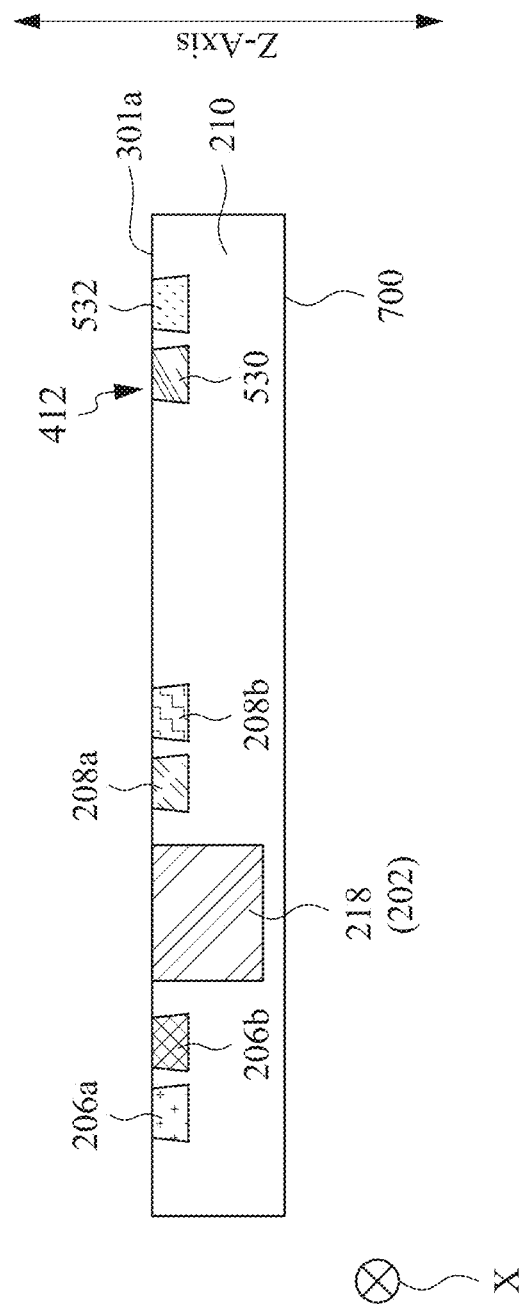

In some embodiments, referring to FIG. 12, thermoelectric members 206a, 208a and thermoelectric members 206b, 208b are formed over the substrate 210. In some embodiments, the thermoelectric members 206b, 208b are adjacent to the thermoelectric members 206a, 208a. In some embodiments, the thermoelectric members 206a, 208a and the thermoelectric members 206b, 208b are formed by doping a first thermoelectric material and a second thermoelectric material different from the first thermoelectric material within openings of the substrate 210. In some embodiments, the thermoelectric members 206a, 208a and the thermoelectric member 206b, 208b are formed by electroplating operations. In some embodiments, the thermoelectric members 206a, 208a and the thermoelectric member 206b, 208b are in configurations as described above or shown in FIGS. 2-5B. In some embodiments, top surfaces of the thermoelectric members 206a, 208a and the thermoelectric member 206b, 208b are substantially level or substantially coplanar with the surface 301a of the substrate 210.

In some embodiments, a control circuit 412 with active regions 530, 532 is formed adjacent to the thermoelectric members 206a, 208a and the thermoelectric member 206b, 208b. In some embodiments, the control circuit 412 such as a die is placed over the substrate 210. In some embodiments, the control circuit 412 is in a configuration as described above or as shown in FIG. 5A.

Figure 13:
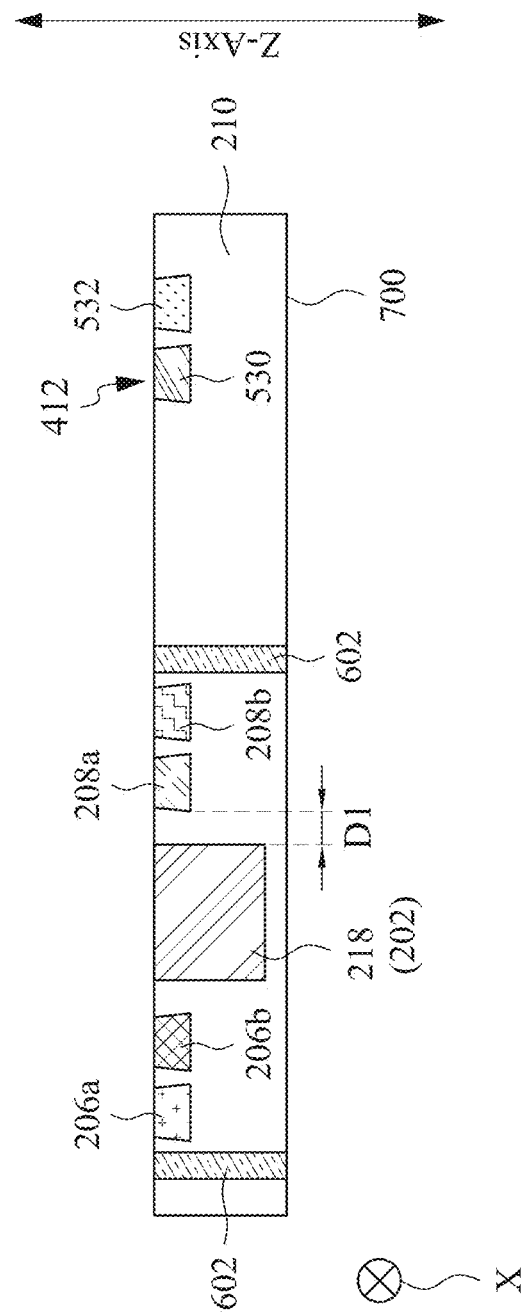

In some embodiments, referring to FIG. 13, TSVs 602 are formed. In some embodiments, the TSVs 602 are formed by removing a portion of the substrate 210 to form an opening, and then disposing a conductive material into the opening. In some embodiments, the removal of the portion of the substrate 210 includes photolithography, etching or other suitable operations. In some embodiments, the disposing of the conductive material includes sputtering, electroplating or other suitable operations. In some embodiments, the TSVs 602 are in a configuration as described with respect to FIG. 7A.

Figure 14:
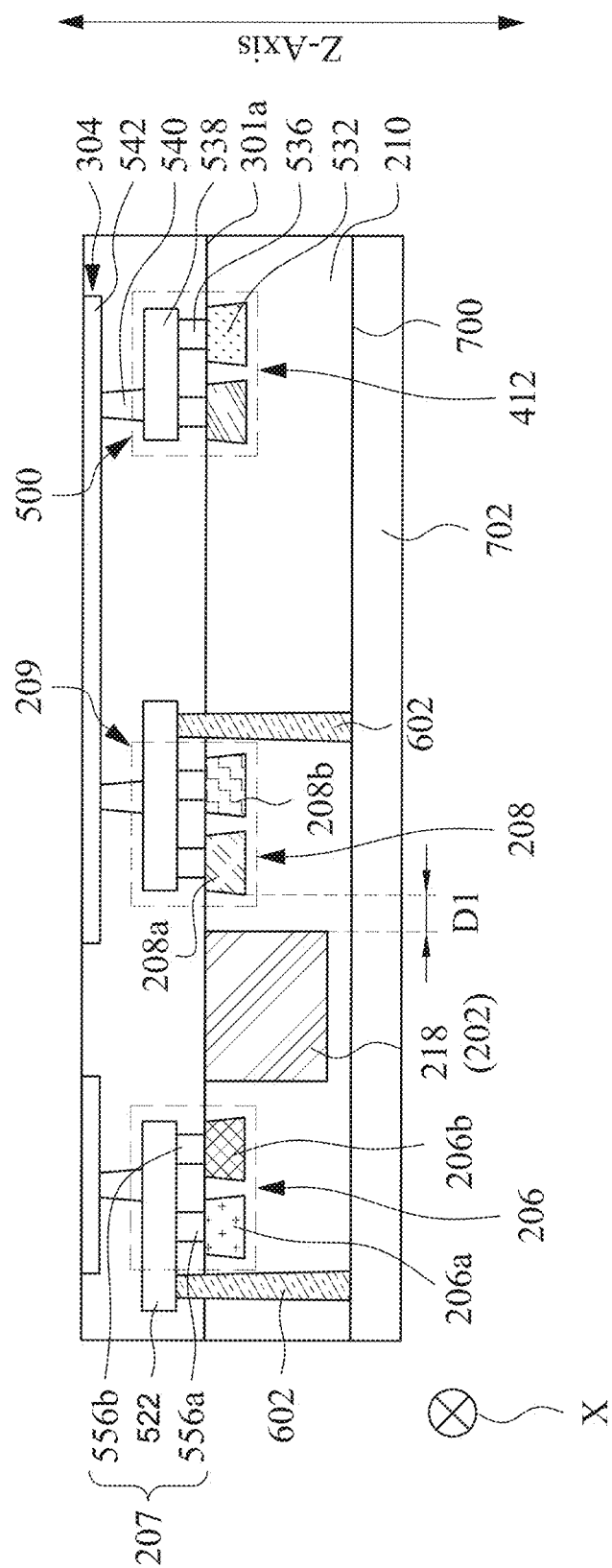

In some embodiments, referring to FIG. 14, a dielectric layer 304 is formed over the substrate 210. In some embodiments, the dielectric layer 304 is formed by suitable fabrication techniques such as spin coating, chemical vapor deposition (CVD), plasma-enhanced chemical vapor deposition (PECVD), or the like. In some embodiments, the dielectric layer 304 is comprised of a single layer or multiple layers stacked over each other.

In some embodiments, conductive structures 207, 209, first interconnect structure 500 are formed within the dielectric layer 304. In some embodiments, the conductive structures 207, 209 and the first interconnect structure 500 are in a configuration as described above or as illustrated in FIGS. 2 to 5B. In some embodiments, the via 556a, the via 556b and a portion of the TSVs 602 protruding from the substrate 210 are surrounded by the dielectric layer 304. In some embodiments, the control circuit 412 is surrounded by the substrate 210 and/or the dielectric layer 304. In some embodiments, one of the TSVs 602 and the thermoelectric members 208a, 208b are between the control circuit 412 and the optical component 202.

In some embodiments, the first interconnect structure 500 is electrically connected to the thermal control mechanisms 206, 208 and the control circuit 412. In some embodiments, some portions of the conductive member 542 of the interconnect structure 500 are exposed by the dielectric layer 304.

In some embodiments, the method further includes forming a heat sink 702. In at least one embodiment, heat sink 702 is electrically connected to the TSVs 602. In some embodiments, the heat sink 702 is formed under the optical component 202, the thermal control mechanisms 206, 208, the TSVs 602, and the control circuit 412. In some embodiments, the heat sink 702 is formed by suitable fabrication techniques such as chemical vapor deposition (CVD), plasma-enhanced chemical vapor deposition (PECVD), or the like. In some embodiments, the heat sink 702 is in a configuration as described above or illustrated in FIG. 7A.

Figure 15:
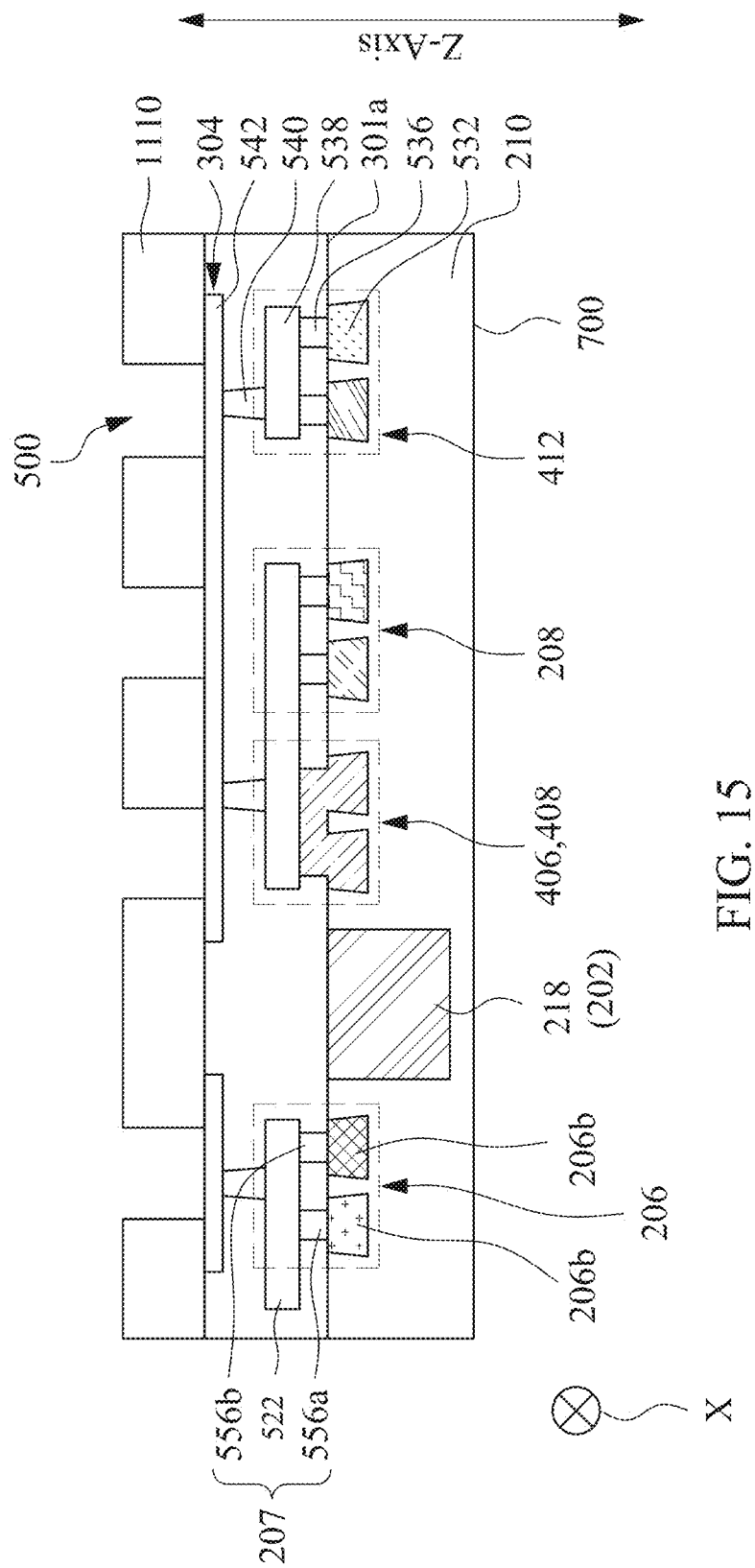

In some embodiments, referring to FIG. 15, before forming dielectric layer 304, the method further includes forming BJTs 406, 408 between the thermal control mechanisms 206, 208 and the optical component 202. In some embodiments, the BJTs 406, 408 is in a configuration as described above or illustrated in FIG. 4. In the example configuration in FIG. 15, TSVs 602 and heat sink 702 are omitted. In at least one embodiment, TSVs 602 and/or heat sink 702 are formed as described with respect to FIGS. 13-14.

In some embodiments, the BJTs 406, 408 are electrically connected to the thermal control mechanisms 206, 208 and the control circuit 412 through the first interconnect structure 500. In some embodiments, the BJTs 406, 408 and the optical component 202 are surrounded along both X-axis and Y-axis by the thermal control mechanisms 206, 208 in a top view. In some embodiments, the formation of the thermal control mechanisms 206, 208, the formation of the BJTs 406, 408, and the formation of the control circuit 412 are performed simultaneously or separately.

In some embodiments, a passivation layer 1110 is formed over the dielectric layer 304 and the first interconnect structure 500. In some embodiments, some portions of the conductive member 542 electrically connected to the BJTs 406, 408 are exposed by the passivation layer 1110.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a semiconductor structure comprises: an optical component comprising a first main path that splits into a first side path and a second side path, wherein the first side path and the second side path are separated from one another; and a first thermal control mechanism configured to control a temperature of both the first side path and the second side path, wherein the first thermal control mechanism includes a first thermoelectric member and a second thermoelectric member that are positioned between the first side path and the second side path, and the first thermoelectric member and the second thermoelectric member have opposite conductive types.

In some embodiments, a semiconductor structure comprises: a phase shifting modulator including: a first main waveguide, a second main waveguide, a first side waveguide having opposite ends correspondingly coupled to the first and second main waveguides, and a second side waveguide spaced from the first side waveguide, and having opposite ends correspondingly coupled to the first and second main waveguides, a first thermal control mechanism configured to control a temperature of the first side waveguide; a second thermal control mechanism configured to control a temperature of the second side waveguide; and a third thermal control mechanism configured to control the temperatures of the first side waveguide and the second side waveguide, wherein the first side waveguide is between the first and third thermal control mechanisms, the second side waveguide is between the second and third thermal control mechanisms, and the third thermal control mechanism is between the first and second side waveguides.

In some embodiments, a method of manufacturing a semiconductor structure, comprises: forming an optical component having a first main path that splits into a first side path and a second side path; forming a first thermoelectric member having a first conductivity type between the first side path and the second side path; forming a second thermoelectric member having a second conductivity type opposite to the first conductivity type between the first side path and the second side path; and forming a conductive structure that electrically connects the first thermoelectric member to the second thermoelectric member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
an optical component comprising a first main path that splits into a first side path and a second side path, wherein the first side path and the second side path are separated from one another;
a first thermal control mechanism configured to control both a temperature of the first side path and a temperature of the second side path, wherein
the first thermal control mechanism includes a first thermoelectric member and a second thermoelectric member that have opposite conductive types, and
the first thermoelectric member and the second thermoelectric member are positioned between the first side path and the second side path;
a substrate; and
a conductive structure, wherein:
the first thermoelectric member and the second thermoelectric member are over a first surface of the substrate;
the conductive structure includes a conductive via and a heat sink;
the heat sink is on a second surface of the substrate, the second surface opposite the first surface;
the conductive via is connected to the first thermoelectric member or the second thermoelectric member; and
the conductive via extends through the substrate from the first surface to the second surface to connect to the heat sink.

2. The semiconductor structure of claim 1, further comprising:
a second thermal control mechanism configured to control the temperature of the first side path, wherein
the second thermal control mechanism includes a third thermoelectric member and a fourth thermoelectric member having the opposite conductive types;
the first thermoelectric member and the second thermoelectric member are adjacent to an interior side of the first side path; and
the third thermoelectric member and the fourth thermoelectric member are adjacent to an exterior side of the first side path.

3. The semiconductor structure of claim 2, further comprising:
a third thermal control mechanism configured to control the temperature of the second side path, wherein
the third thermal control mechanism includes a fifth thermoelectric member and a sixth thermoelectric member having the opposite conductive types;

the first thermoelectric member and the second thermoelectric member are adjacent to an interior side of the second side path; and the fifth thermoelectric member and the sixth thermoelectric member are adjacent to an exterior side of the second side path.

4. The semiconductor structure of claim 1, further comprising:
a thermal isolation material over the substrate and between the optical component and the first and second thermoelectric members.

5. The semiconductor structure device of claim 1, wherein
the optical component further comprises a second main path;
the first main path is attached to a first end of the first side path and a second end of the second side path;
the second main path is attached to a third end of the first side path and a fourth end of the second side path;
the first end being oppositely disposed to the third end; and
the second end being oppositely disposed to the fourth end.

6. The semiconductor structure of claim 1, further comprising:
a temperature sensing circuit configured to sense the temperature of at least one of the first side path or the second side path.

7. The semiconductor structure of claim 6, wherein the temperature sensing circuit comprises a bandgap temperature sensor.

8. The semiconductor structure of claim 6, wherein the temperature sensing circuit comprises one or more thermal sensing devices located at a distance between 0.028 micrometers and 0.5 micrometers from the at least one of the first side path or the second side path.

9. The semiconductor structure of claim 8, wherein
the one or more thermal sensing devices comprises a pair of bipolar junction transistors located between the first side path and the second side path.

10. The semiconductor structure of claim 6, further comprising:
a control circuit, wherein:
the temperature sensing circuit is configured to transmit signals based on the sensed temperature of the at least one of the first side path or the second side path to the control circuit; and
the control circuit is configured to control a current through at least one of the first thermoelectric member or the second thermoelectric member based on the sensed temperature.

11. The semiconductor structure of claim 1, wherein
at least one of the first thermoelectric member or the second thermoelectric member comprises at least one of doped Si, $Bi_2TE_3$, SiGe, or PbTe.

12. A semiconductor structure, comprising:
an optical component comprising a first main path that splits into a first side path and a second side path, wherein the first side path and the second side path are separated from one another;
a first thermal control mechanism configured to control a temperature of the first side path; and a second thermal control mechanism configured to control both the temperature of the first side path and a temperature of the second side path, wherein
along a first axis,
the first side path is between the first thermal control mechanism and the second thermal control mechanism, and
the second thermal control mechanism is between the first side path and the second side path, and
each of the first thermal control mechanism and the second thermal control mechanism comprises a first thermoelectric member, a second thermoelectric member, a third thermoelectric member and a fourth thermoelectric member, wherein:
the third thermoelectric member is of a same first conductivity as the first thermoelectric member;
the fourth thermoelectric member is of a same second conductivity as the second thermoelectric member, the second conductivity different from the first conductivity;
the first thermoelectric member, the second thermoelectric member, the third thermoelectric member, and the fourth thermoelectric member are aligned in a column along a second axis transverse to the first axis;
the second thermoelectric member is positioned between the first thermoelectric member and the third thermoelectric member in the column; and
the third thermoelectric member is positioned between the second thermoelectric member and the fourth thermoelectric member in the column.

13. The semiconductor structure of claim 12, further comprising:
a substrate, wherein the first and second thermal control mechanisms and the optical component are over the substrate; and
a first conductor overlapping the first side path in a thickness direction of the substrate,
wherein the first conductor and the first side path are elongated along the second axis, and the first conductor is coupled to receive a current to heat the first side path from above.

14. The semiconductor structure of claim 13, further comprising:
a control circuit;
a first conductive structure electrically coupling the control circuit to the first thermal control mechanism; and
a second conductive structure electrically coupling the control circuit to the second thermal control mechanism, wherein
the first conductive structure comprises a first set of conductors serially connecting the first through fourth thermoelectric members of the first thermal control mechanism,
the second conductive structure comprises a second set of conductors serially connecting the first through fourth thermoelectric members of the second thermal control mechanism, and
along the first axis, the first conductor is between the first set of conductors and the second set of conductors.

15. The semiconductor structure of claim 14, wherein
the first conductor, the first set of conductors and the second set of conductors are in a same metal layer.

16. A semiconductor structure, comprising:
an optical component comprising:
- a first main path,
- a second main path,
- a first side path having opposite ends correspondingly coupled to the first and second main paths, and
- a second side path spaced from the first side path, and having opposite ends correspondingly coupled to the first and second main paths, a first thermal control mechanism configured to control a temperature of the first side path;
a second thermal control mechanism configured to control a temperature of the second side path;
a third thermal control mechanism configured to control the temperatures of the first side path and the second side path;
a control circuit;
a first conductive structure electrically coupling the control circuit to the first thermal control mechanism;
a second conductive structure electrically coupling the control circuit to the second thermal control mechanism; and
a third conductive structure electrically coupling the control circuit to the third thermal control mechanism, wherein
the first side path is between the first and third thermal control mechanisms,
the second side path is between the second and third thermal control mechanisms,
the third thermal control mechanism is between the first and second side paths,
each of the first, second and third thermal control mechanisms comprises a first thermoelectric member and a second thermoelectric member which have opposite conductive types, and
the control circuit is configured to supply at least one of
- a first current to the first thermal control mechanism through the first conductive structure, without causing the first current to flow through the second and third thermal control mechanisms,
- a second current to the second thermal control mechanism through the second conductive structure, without causing the second current to flow through the first and third thermal control mechanisms, or
- a third current to the third thermal control mechanism through the third conductive structure, without causing the third current to flow through the first and second thermal control mechanisms.

17. The semiconductor structure of claim 16, further comprising:
a temperature sensing circuit adjacent to, and configured to sense a temperature of, at least one of the first side path or the second side path,
wherein the control circuit is electrically coupled to the temperature sensing circuit and configured to, in response to the sensed temperature, supply the at least one of the first current, the second current or the third current correspondingly to at least one of the first thermal control mechanism, the second thermal control mechanism, or the third thermal control mechanism to drive the temperature to a target temperature.

18. The semiconductor structure of claim 17, further comprising:
a substrate, wherein the first through third thermal control mechanisms and the optical component are over the substrate; and
a thermal isolation material over the substrate and between the optical component and the first and second thermoelectric members of each of the first through third thermal control mechanisms, wherein
each of the first main path, the second main path, the first side path and the second side path comprises a core, and the thermal isolation material comprises a cladding having a width of between 0.028 micrometers and 0.5 micrometers, and
the temperature sensing circuit comprises one or more thermal sensing devices located at a distance between 0.028 micrometers and 0.5 micrometers from the at least one of the first side path or the second side path.

19. The semiconductor structure of claim 17, wherein along a first axis
the first side path is between the first and third thermal control mechanisms,
the second side path is between the second and third thermal control mechanisms,
the third thermal control mechanism is between the first and second side paths, and
at least one thermal sensing device of the temperature sensing circuit is between the second side path and the second thermal control mechanism.

20. The semiconductor structure of claim 16, wherein
in each of the first, second and third thermal control mechanisms, at least one of the first thermoelectric member or the second thermoelectric member comprises at least one of doped Si, $Bi_2TE_3$, SiGe, or PbTe.

* * * * *